United States Patent
Boddie et al.

(10) Patent No.: US 7,989,725 B2
(45) Date of Patent: Aug. 2, 2011

(54) PROXIMITY SENSOR FOR A VEHICLE

(75) Inventors: Will Boddie, Ann Arbor, MI (US); Juan Bravo, Wingdale, NY (US); Danny Ray Caldwell, Grand Blanc, MI (US); Joseph Driesta, Demarest, NJ (US); Anthony Gentile, New York, NY (US); John Gentile, Montclair, NJ (US); Terrance Kaiserman, Loxahatchee, FL (US); Mangesh Soman, South Lyon, MI (US); Dan Tashman, White Plains, NY (US)

(73) Assignee: Ink-Logix, LLC, Birmingham, MI (US)

( * ) Notice: Subject to any disclaimer, the term of this patent is extended or adjusted under 35 U.S.C. 154(b) by 689 days.

(21) Appl. No.: 11/929,463

(22) Filed: Oct. 30, 2007

(65) Prior Publication Data

US 2008/0202912 A1 Aug. 28, 2008

Related U.S. Application Data

(60) Provisional application No. 60/855,327, filed on Oct. 30, 2006.

(51) Int. Cl.
*H03K 17/975* (2006.01)
(52) U.S. Cl. .................................. 200/600; 200/310
(58) Field of Classification Search ................ 200/600
See application file for complete search history.

(56) References Cited

U.S. PATENT DOCUMENTS

| | | | | |
|---|---|---|---|---|
| 4,400,758 A * | 8/1983 | Frame | | 200/600 |
| 4,562,315 A * | 12/1985 | Aufderheide | | 200/5 A |
| 5,239,152 A * | 8/1993 | Caldwell et al. | | 200/600 |
| 5,455,749 A | 10/1995 | Ferber | | |
| 5,626,948 A | 5/1997 | Ferber et al. | | |
| 5,636,948 A | 6/1997 | Rexius | | |
| 5,730,165 A | 3/1998 | Philipp | | |
| 5,973,420 A | 10/1999 | Kaiserman et al. | | |
| 5,973,623 A | 10/1999 | Gupta et al. | | |
| 6,137,072 A * | 10/2000 | Martter et al. | | 200/512 |
| 6,188,506 B1 | 2/2001 | Kaiserman et al. | | |
| 6,288,707 B1 | 9/2001 | Philipp | | |
| 6,377,009 B1 | 4/2002 | Philipp | | |
| 6,452,514 B1 | 9/2002 | Philipp | | |
| 6,457,355 B1 | 10/2002 | Philipp | | |
| 6,466,036 B1 | 10/2002 | Philipp | | |
| 6,535,200 B2 | 3/2003 | Philipp | | |
| 7,594,442 B2 | 9/2009 | Kaiserman et al. | | |

* cited by examiner

*Primary Examiner* — Renee Luebke
*Assistant Examiner* — Lheiren Mae Caroc
(74) *Attorney, Agent, or Firm* — Lerner, David, Littenberg, Krumholz & Mentlik, LLP

(57) ABSTRACT

A proximity sensor for controlling a component that may be installed on a window, on an interior or exterior pillar of a vehicle, on a control panel or any suitable location on a vehicle or any other structure. The sensor includes a substrate and a conductive layer disposed on the substrate. The conductive layer is formed from a conductive ink composition with the conductive layer defining at least one circuit for controlling the component when a user is in proximity to the conductive layer. A protective layer is disposed over the conductive layer. At least one of the conductive layer and the protective layer defines a graphic formed through the layer for visual identification to the user.

22 Claims, 15 Drawing Sheets

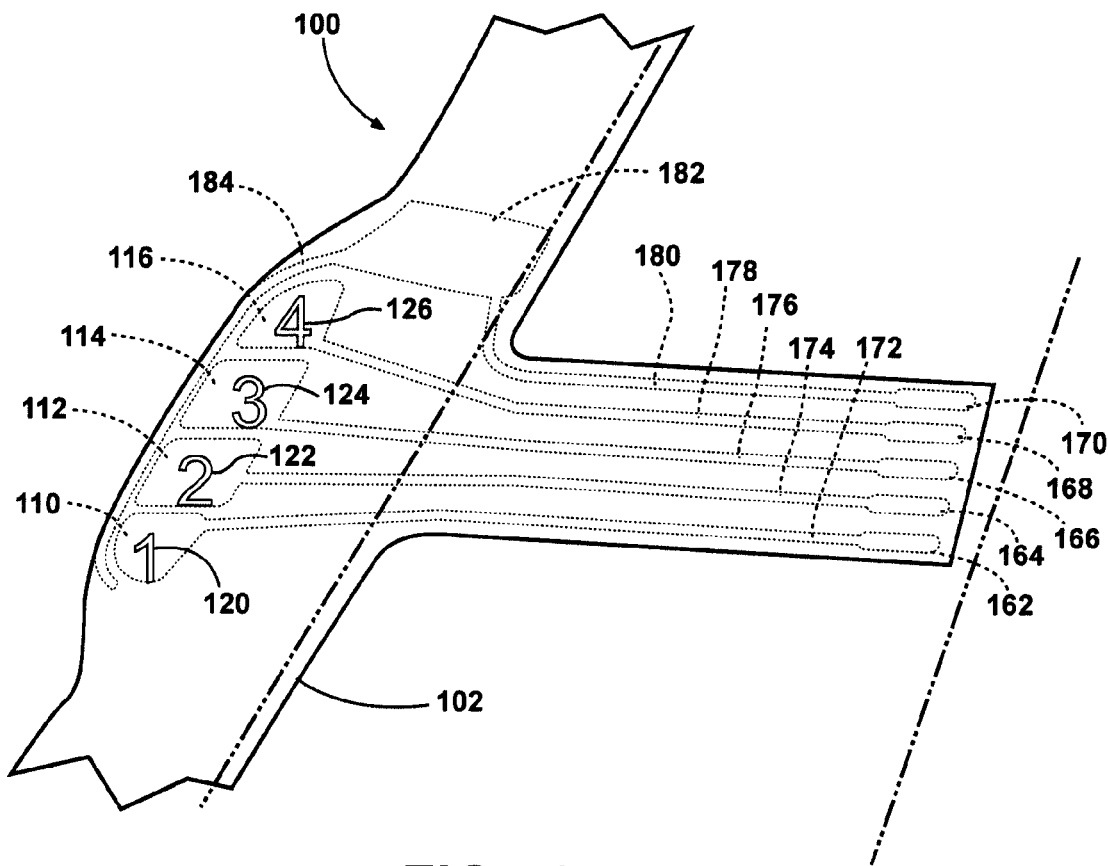
FIG - 2
FIG - 4
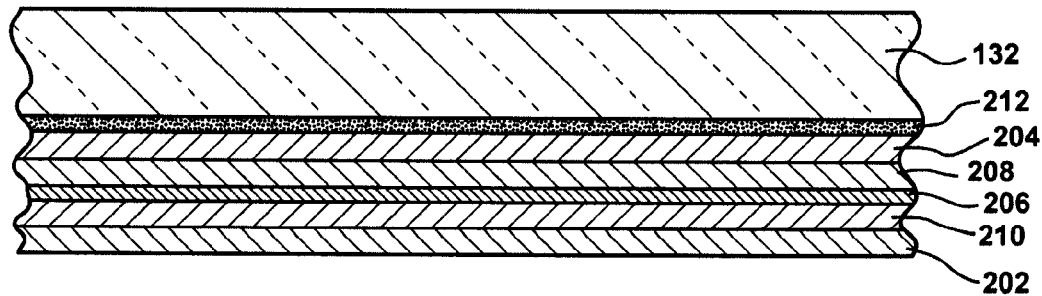

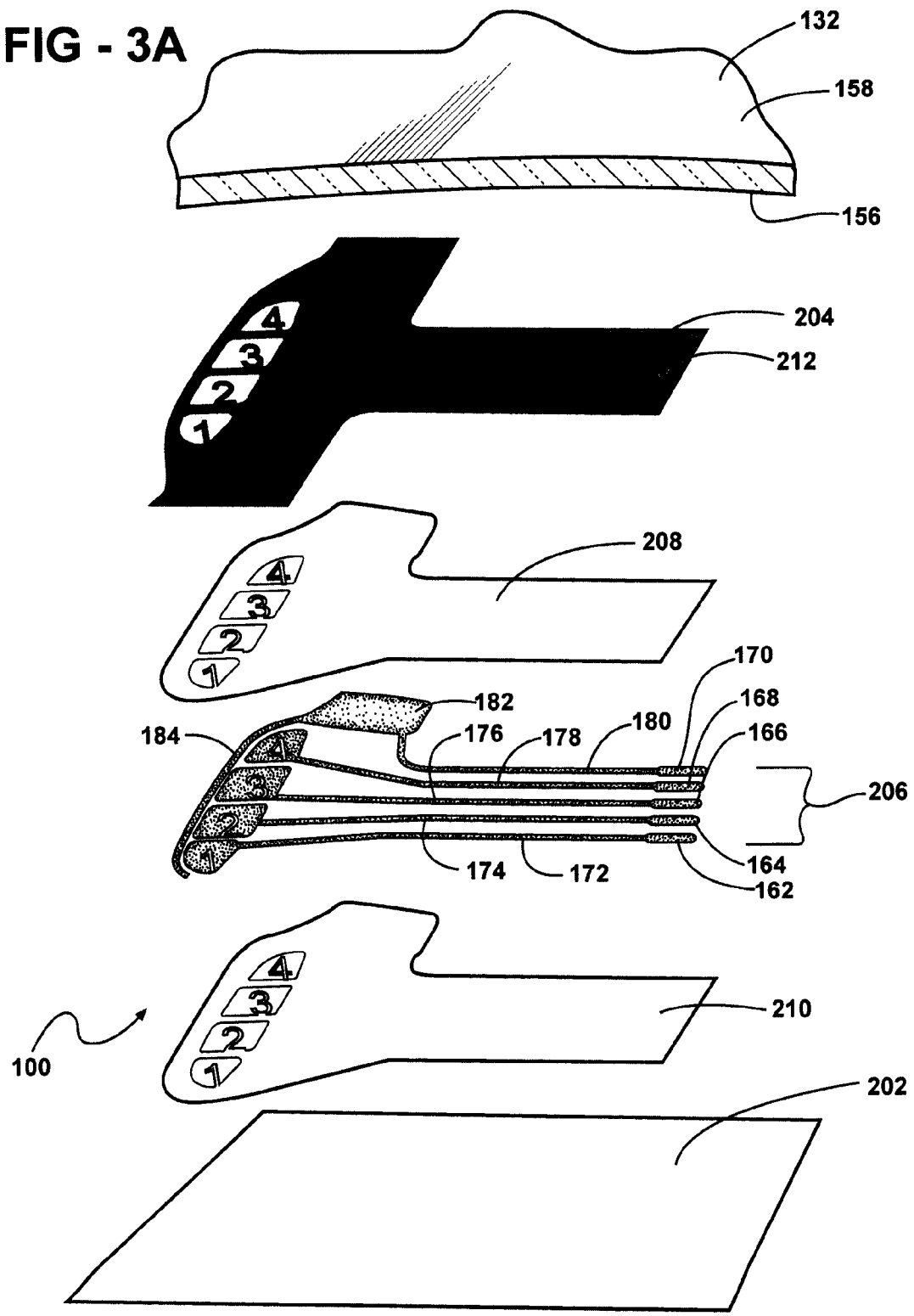

US 7,989,725 B2

PROXIMITY SENSOR FOR A VEHICLE

CROSS-REFERENCE TO RELATED APPLICATIONS

The subject patent application claims priority to and all the benefits of U.S. Provisional Patent Application Ser. No. 60/855,327, which was filed on Oct. 30, 2006.

BACKGROUND OF THE INVENTION

1. Field of the Invention

The present invention relates generally to sensor or switch, and more particularly concerns capacitive switches, in vehicular applications.

2. Description of Related Art

User operated switching mechanisms for automotive or other vehicle applications typically involve mechanical switches affixed to the vehicle. Such known switching mechanisms can be aesthetically unattractive, and their installation frequently requires extensive modification to the vehicle. For example, automotive keyless entry systems typically include radio-frequency key fobs to lock and unlock the doors of a vehicle. However, these systems require the user to possess the key fob to unlock the doors. In an attempt to allow a user to unlock a vehicle door without a key or a key fob, mechanical keypad entry systems are available that are installed on the vehicle exterior. These systems include electromechanical switches installed on the outside of the vehicle and require routing wires into the vehicle interior. However, these systems are expensive and require extensive modification to the vehicle exterior including drilling holes and attempting to seal the electromechanical switch unit.

Interior switches suffer from similar drawbacks. Despite prior efforts to provide interior switches, particularly for the automotive aftermarket, known switch gear is dimensionally thick, intrusive, not aesthetically pleasing, and requires significant modification to the vehicle interior.

Accordingly, there is a need to provide a sensor or switch, particularly in vehicle applications, that is less intrusive, aesthetically pleasing, and requires minimal modification to the vehicle.

SUMMARY OF THE INVENTION AND ADVANTAGES

The subject invention provides a proximity sensor for controlling a component. The sensor comprises a substrate and a conductive layer disposed on the substrate. The conductive layer is formed from a conductive ink composition with the conductive layer defining at least one circuit for controlling the component when a user is in proximity to the conductive layer. A protective layer is disposed over the conductive layer. At least one of the conductive layer and the protective layer defines a graphic formed through the layer for visual identification to the user.

The subject invention also provides a window having an integrated proximity sensor for controlling the component. The window comprises a pane of glass and the protective layer is coupled to the pane of glass. The conductive layer is disposed on the protective layer and formed from the conductive ink composition with the conductive layer defining the at least one circuit for controlling the component when the user is in proximity to the pane of glass. The substrate is coupled to the conductive layer for protecting the conductive layer. Both of the conductive layer and the protective layer define a graphic formed through the layers with the graphics at least partially aligned for permitting light to pass through the proximity sensor.

The subject invention further provides a bezel for mounting to a surface of a vehicle to control a component of a vehicle. The bezel comprises a primary substrate and the protective layer disposed on the primary substrate. The protective layer includes a graphic formed through the protective layer for identification by the user. The conductive layer is coupled to the primary substrate and is formed from the conductive ink composition with the conductive layer defining at least one circuit for controlling the component of the vehicle when the user is in proximity to the protective layer.

Accordingly, the subject invention provides for a thin, aesthetically pleasing sensor or switch of great versatility that can be utilized in a variety of locations on a vehicle or other suitable locations for a variety of purposes to control a variety of components.

BRIEF DESCRIPTION OF THE DRAWINGS

Other advantages of the present invention will be readily appreciated as the same becomes better understood by reference to the following detailed description when considered in connection with the accompanying drawings wherein:

FIG. 2 is an enlarged plan view of a proximity sensor mounted to a windshield of the vehicle in accordance with the subject invention;

FIG. 3A is an exploded perspective view of the proximity sensor;

FIG. 4 is a cross-sectional view of the proximity sensor of FIG. 3A;

DETAILED DESCRIPTION OF THE INVENTION

Figure 1:
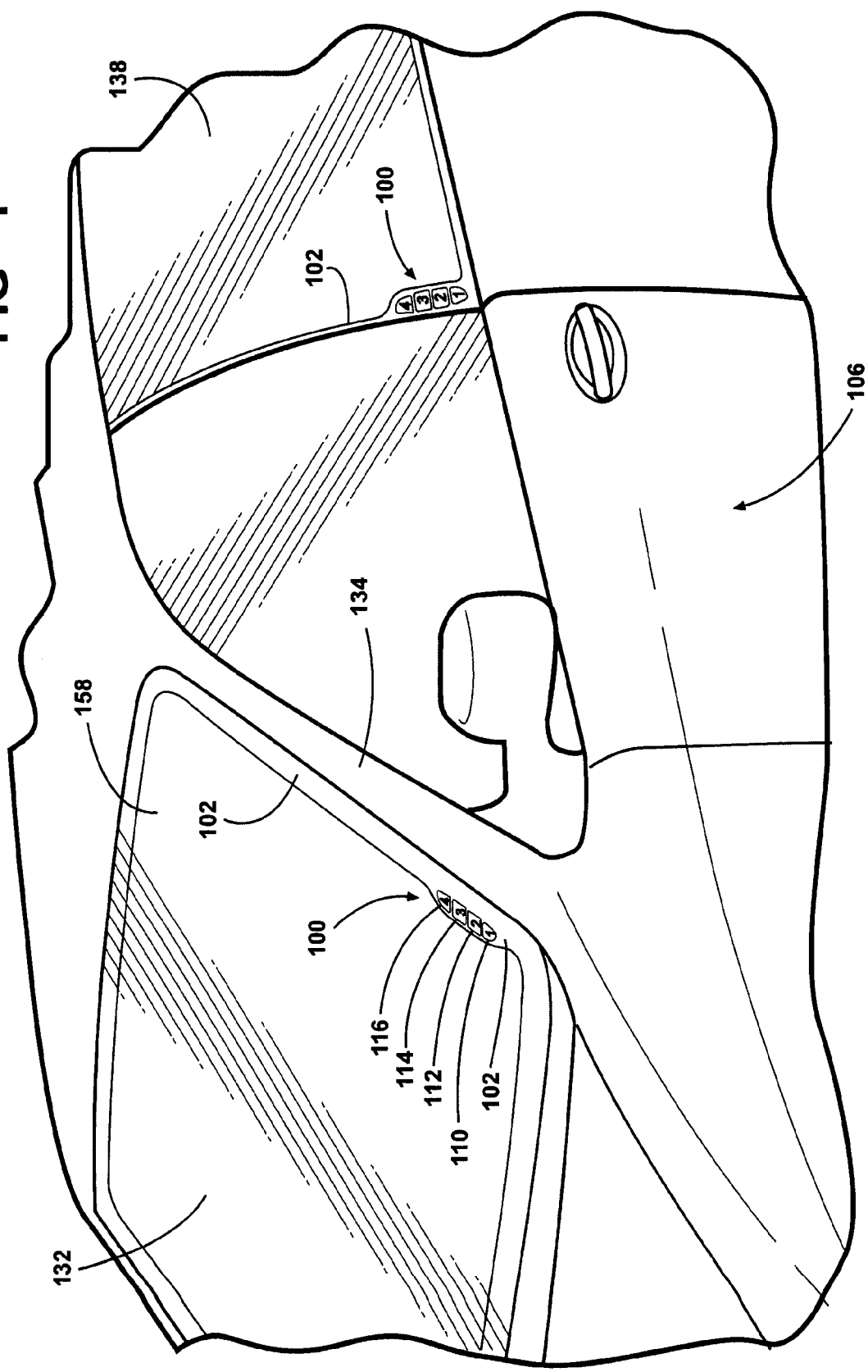
FIG. 1 is a perspective view of an exterior of a vehicle incorporating proximity sensors in accordance with the subject invention.

Set forth below are various embodiments of sensors or switches. The embodiments of the sensors or switches are illustrated by depicting their use in a variety of applications including keyless entry, accessory control, and displays. However, it is understood that the sensors, switches, switching elements, and switching circuits described herein are not to be limited to the particular embodiments described. For example, although the embodiments are described in the context of automotive applications, the disclosed sensors or switches may be useful for other applications and industries such as consumer electronics, switches used for structures (e.g., buildings or houses), or other areas where thin, durable, and configurable sensors or switches are desirable. Moreover, for example, the sensor or switch embodiments utilizing window glass may be useful for LCD display touch inputs or keyless entry to a house.

The sensor or switch embodiments described herein generally relate to proximity or capacitive sensors or switches. Capacitive switching detects changes in capacitance due to a disturbance that defines a switching event. In preferred embodiments, the disturbance is a presence of a finger of a user or other object placed proximal to a sensing pad. However, the sensor or switch embodiments described herein may also comprise direct input switches where a user directly touches an electrode surface. Capacitive sensing or switching provides immunity to interference as well as eliminating electromechanical switch gear (e.g., pushbuttons or sliding switches). Moreover, because there are no moving parts, the failure rate is low.

In one embodiment, when a conductive object, such as a finger, is placed near a sensing pad the pad's capacitance changes, indicating the occurrence of a switching event. The pad's capacitance changes are detected by sensing circuitry. The sensing circuitry can be tuned to detect specific changes in capacitance. For example, the sensing circuitry can be tuned to detect the presence of a finger proximal a sensing pad, while not detecting other types of disturbances (e.g., moisture).

In addition to noise immunity and tuning capabilities, capacitive switches may be embodied as thin designs. In certain embodiments, the sensing pad may comprise a conductive ink printed on a thin substrate, such as a thin plastic sheet. Additionally, capacitive switches are typically less costly than their electromechanical counterparts.

Examples of capacitive switch sensing electronics are known in the art, for example, U.S. Pat. No. 5,973,623 to Gupta et al., filed Oct. 21, 1997, entitled "Solid state capacitive switch," the entire contents of which is incorporated by reference herein. Moreover, as discussed herein, the capacitive switches may be used to detect an object at a distance as well as a touch. Additionally, the switches described herein are capable of distinguishing the presence of a finger, for example, from rain. These sensing operations are described in detail with respect to U.S. Pat. Nos. 5,730,165, 6,288,707, 6,377,009, 6,452,514, 6,457,355, 6,466,036, 6,535,200, the entire contents of which are incorporated by reference herein.

Certain of the capacitive switches described herein comprise a conductive layer. A conductive ink typically comprises a resin, a vehicle, and a conductive material. The conductive materials are selected from the group of silver particles, nickel particles, iron particles, stainless steel particles, graphite particles, carbon particles, carbon nanotubes, conductive polymer, gold particles, platinum particles, palladium particles, copper particles, zinc particles, aluminum particles, silver-coated glass particles, silver coated-copper particles, silver-coated nickel particles, and combinations thereof.

The resins may be any type of resins typically used for surface coatings, such as acrylamide, acrylics, phenolics, bisphenol A type epoxy, shellac, carboxymethylcellulose, cellulose acetate butyrate, cellulosics, chlorinated polyether, chlorinated rubber, epoxy esters, ethylene vinyl acetate copolymers, maleics, melamine, natural resins, nitrocellulose solutions, isocyanates, hydrogenated resin, polyamide, polycarbonate, rosins, polyesters, polyethylene, polyolefins, polypropylene, polystyrene, polyurethane, polyvinyl acetate, silicone, vinyls and water thinned resins. The selected resins may be either water soluble or soluble in an organic solvent-based system. Alternatively, the resin may be dispersible in a suitable liquid, rather than truly soluble therein. A liquid dispersion medium may be used in which the resin is dispersed, but in which other materials are truly dissolved. The resin may be used with or without crosslinking. If crosslinking is desired, it may be obtained by using a crosslinking agent or by application of heat or radiation (e.g., infrared, electron beam (EB), or ultraviolet radiation (UV)) to the composition.

Specific conductive compositions that are suitable for use in the embodiments described below are those described in U.S. Pat. Nos. 5,626,948 and 5,455,749, the entire contents of which are incorporated by reference herein.

An example of a conductive layer (a silver-based polymer thick film ink) suitable for printing electrodes, traces, and contacts, described herein is Electrodag 820B (available from Acheson Colloids of Port Huron, Mich.). Another exemplary conductive coating comprises about 30 percent to about 60 percent of a urethane dispersion, about 30 percent to about 60 percent silver powder, about one (1) percent defoamer, and about 20 percent to about 30 percent silver flakes (all percentages by weight). A preferred example of a water resistant, water-based silver ink coating comprises about 29.8 percent of a Zeneca R972 urethane dispersion, about one (1) percent of a C. J. Patterson, Patcoat 841 Defoamer, about 45.2 percent of HRP Metals D3 Silver powder, and about 24 percent of Techniks 135 silver flakes (all percentages by weight).

In other embodiments, rather than using conductive ink, other materials may be used such as sputtered metals, conductive plastic, conductive non-woven materials, conductive woven fabrics, etc. Where, for example, a conductive woven fabric is used, the conductive woven fabric may be die-cut to shape and fixed at the switch location.

As indicated above, in certain embodiments, a capacitive switch comprises a sensing pad or region formed by printing a conductive ink onto a substrate. In addition, electrically conductive traces may be printed on a substrate to connect the sensing pad to a switching circuit. Suitable printing processes include, but are not limited to, screen printing, off-set printing, gravure printing, flexographic printing, pad printing, intaglio printing, letter press printing, ink jet printing, and bubble jet printing. The ink is preferably selected to be compatible with the substrate and the printing process. Depending on the process selected, relatively high viscosity pastes may be used, as well as liquid inks having a viscosity of five thousand centipoise (5000 cp) (Brookfield viscosity) or less. High viscosity pastes are well-suited for screen printing processes while lower viscosity inks are better suited for processes such as gravure and flexographic printing. Depending on the specific printing process and substrate, shear thinning ink such as pseudoplastic or thixotropic inks may be used, as well as dilatent or shear thickening inks.

Figure 5:
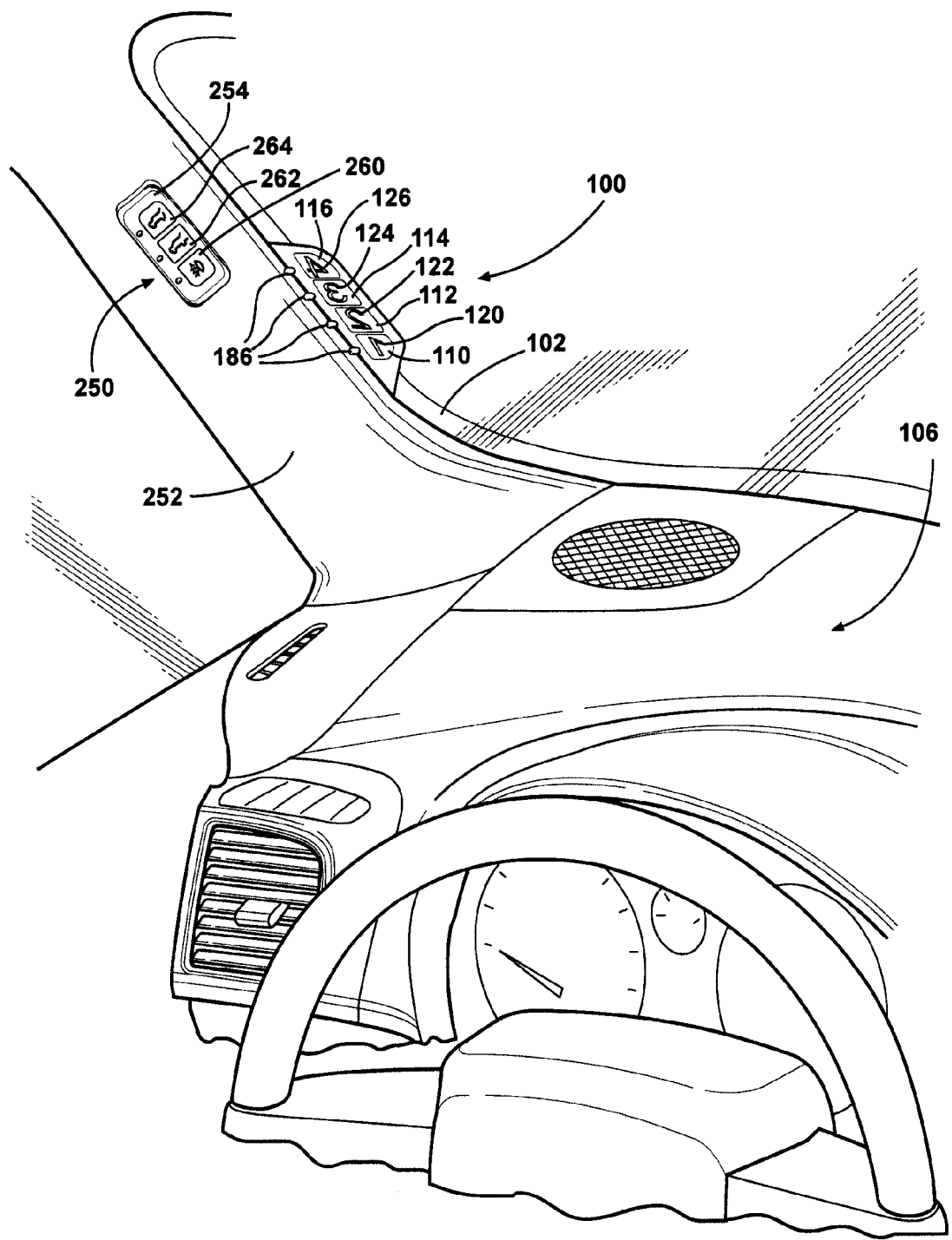
FIG. 5 is a perspective view of an interior of a vehicle incorporating proximity sensors in accordance with the subject invention.

Turning now to the Figures, FIG. 1 is a perspective view of an exterior of a vehicle 106 and FIG. 5 is a perspective view of an interior of the vehicle 106. The exterior or interior of the vehicle 106 include at least one proximity sensor 100, 250 for controlling a component of the vehicle. As shown in FIG. 1, a proximity sensor 100 is mounted to a windshield 132 and also to a side window 138 of the vehicle 106. FIG. 5 illustrates the proximity sensor 100 on the windshield 132 and another proximity sensor 250 mounted to a pillar, such as an A-pillar 134, of the vehicle 106. It should be appreciated that any number of proximity sensors may be disposed in any variety of locations throughout the vehicle for controlling a variety of components of the vehicle. As discussed in greater detail below, the proximity sensors may also be of a variety of configurations.

Turning to FIGS. 1-4, the proximity sensor 100 for controlling the component of the vehicle 106 is shown in greater detail. The proximity sensor 100 of this embodiment is preferably integrated into a window of the vehicle, such as the windshield 132 or the side window 138. The window includes a pane of glass with a trim blending region 102 (known in the industry as a black-out region), which is typically black, disposed around a perimeter of the window. The windshield 132 is typically fixedly mounted to the A-pillar 134 with the trim blending region 102 hiding any bonding areas or other non-aesthetic features. The proximity sensor 100 preferably integrates with the trim blending region 102 to form a seamless looking sensor 100. As a result, the sensor 100 can readily be supplied as an aftermarket part that provides the appearance of an original equipment manufacturer (OEM) installation. The A-pillar 134 is advantageously located to receive an electrical connection from the sensor 100 for connection to sensing circuitry, or alternatively, directly to an electronic control unit (ECU).

In a preferred embodiment, the sensor 100 is bonded to the windshield 132 at an interface on an inner surface 156 of the windshield 132 using, in a preferred embodiment, a permanent contact adhesive. Other embodiments may include use of a pressure-sensitive adhesive, static cling, or sensor 100 may be wedged against the windshield 132 using the A-pillar 134. The bonding is intended to be semi-permanent such that sensor 100 will not delaminate from windshield 132 over time, exposure to sun, thermal cycling, and/or abrasion.

As best shown in FIGS. 3A and 4, the sensor 100 includes a substrate 202. In one embodiment, the substrate 202 is die cut from a sheet of Polyethylene Terephthalate (PET) material such as Mylar (R) (available from Dupont Teijin Films Company of Wilmington, Del.). Preferably, the substrate 202 is formed of a clear polymeric material. A conductive layer 206 and at least one protective layer 208, 210 are disposed over the substrate 202. Preferably, the conductive layer 206 is sandwiched between a first protective layer 208 and a second protective layer 210. The substrate 202 is used as a structural carrier for the conductive layer 206 and the protective layers 208, 210. In this embodiment, substrate 202 also provides a protective layer facing the interior of the vehicle 106. A preferred thickness of the substrate 202 is about one eighth millimeter (0.125 mm).

A concealing layer 204 is disposed over the conductive layer 206. The concealing layer 204 comprises a non-conductive printed pattern that cooperates with the trim blending region 102 as well as adding opacity to the areas where conductive layer 206 forms structures. Preferably, the concealing layer 204 is formed of a dark colored material similar to that of the trim blending region 102 to hide the conductive layer 206. As illustrated, the concealing layer 204 is disposed over the first protective layer 208 and is adhered to the window 132.

Figure 3B:
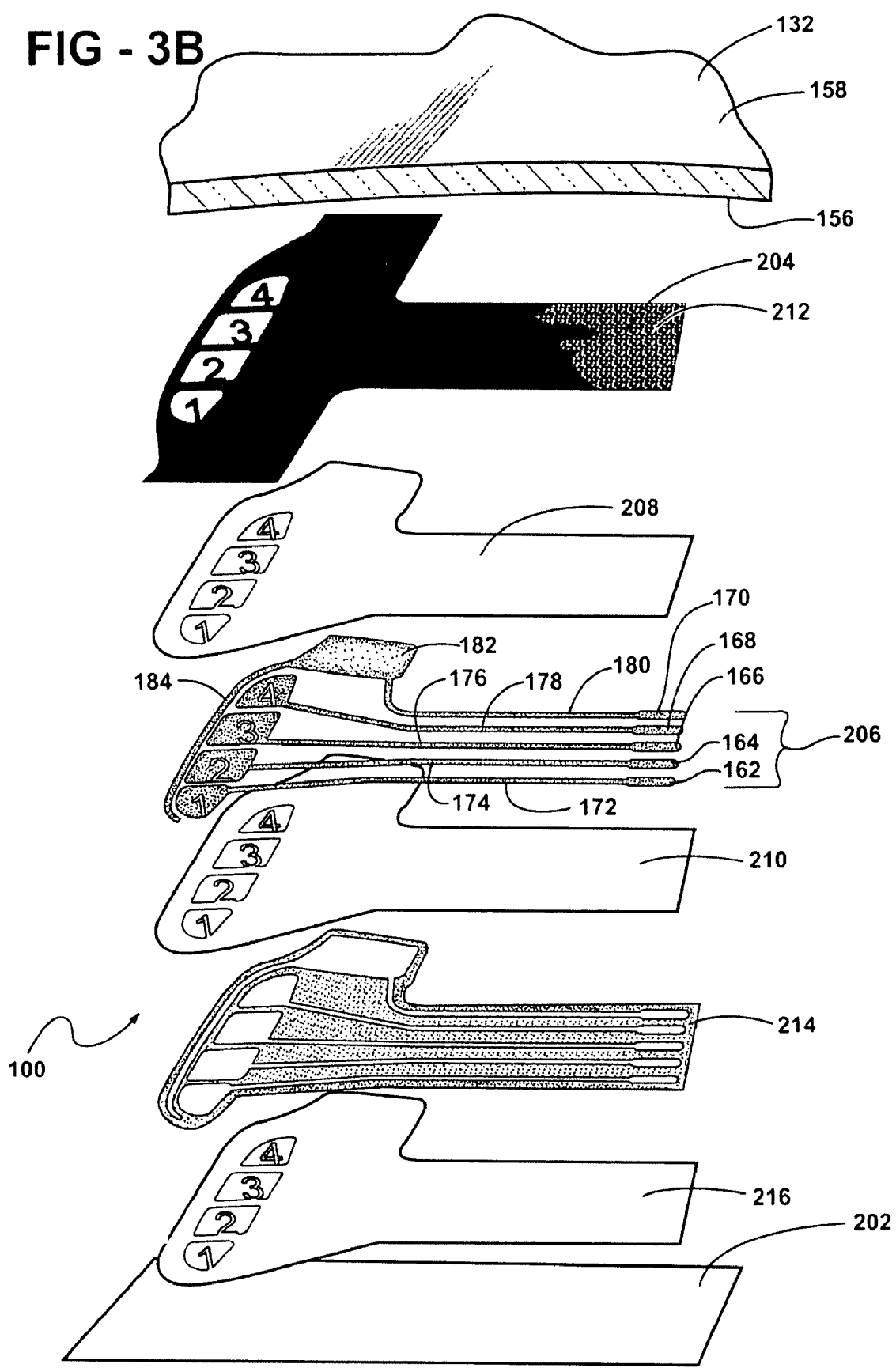
FIG. 3B is an exploded perspective view of an alternative proximity sensor.

As best shown in FIG. 3B, the sensor 100 again includes the substrate 202. As with the embodiment of FIG. 3A, a conductive layer 206 and at least one protective layer 208, 210 are disposed over the substrate 202. Preferably, the conductive layer 206 is sandwiched between a first protective layer 208 and a second protective layer 210. In this embodiment, a grounding layer 214 is peripherally aligned with the conductive layer 206. In other words, the grounding layer 214 outlines the perimeter of the conducting layer 206 and fills any gaps between the circuits of the conducting layer 206. As shown, the grounding layer 214 is disposed below the conducting layer 206. Preferably, the grounding layer 214 is sandwiched between the second protective layer and a third protective layer 216. The third protective layer is disposed on the substrate 202. The substrate 202 is therefore used as a structural carrier for the conductive layer 206, grounding layer 214, and protective layers 208, 210, 216. In this embodiment, substrate 202 also provides a protective layer facing the interior of the vehicle 106. As with the embodiment of FIG. 3A, the concealing layer 204 shown in FIG. 3B is disposed over the conductive layer 206 and is preferably disposed over the first protective layer 208 and adhered to the window 132 by the adhesive layer 212.

In the broad sense, at least one of the protective layers 208, 210 is coupled to the pane of glass. The conductive layer 206 is disposed on the protective layer 210 and the substrate 202 is coupled to the conductive layer 206 for protecting the conductive layer 206. More specifically, the first protective layer 208 is further defined as a first dielectric layer 208 and the second protective layer 210 is further defined as a second dielectric layer 210 disposed between the conductive layer 206 and the substrate 202 to sandwich the conductive layer 206 between the first 208 and second 210 dielectric layers. An adhesive layer 212 is disposed between the concealing layer 204 and the pane of glass for adhering the proximity sensor 100 to the pane of glass.

In the embodiment shown in FIGS. 1-3B, the proximity sensor 100 includes a first touch zone 110, a second touch zone 112, a third touch zone 114, and a fourth touch zone 116. First, second, third, and fourth touch zones 110, 112, 114, 116 respectively include a first graphic 120, a second graphic 122, a third graphic 124, and a fourth graphic 126. Graphics 120, 122, 124, and 126 define a set of graphics that may include symbols, alpha-numeric characters, or other graphics indicative of a desired operation or distinguishing one touch zone 110, 112, 114, 116 from another. However, in this embodiment, the touch zones 110, 112, 114, 116 are numeric characters used to effect specific sequences of the touching zones 110, 112, 114, and 116.

It is further contemplated that embodiments may include an unlimited number of touch zones and may be placed at any location. For example, touch zones may be located on the dashboard, A-pillar, B-pillar etc., as well as on the glass portions of a vehicle (e.g., windows), seats, and exterior surfaces (e.g., roof, doors, hood, etc.). Thus, as discussed herein, the embodiments are exemplary and are not limiting. Moreover, as discussed in detail below, each touch zone may detect the presence of a switching object at various distances (e.g., two inches (2") or six inches (6")). Indeed, each individual switch zone, within a cluster (e.g., sensor 100 including touch zones 110, 112, 114, and 116) or as an individual switch among multiple clusters, is configurable for its own switching characteristics.

In this embodiment, sensor 100 is intended for installation in a motor vehicle. In a preferred embodiment, sensor 100 is bonded to the interior surface of the windshield 132 and is used for keyless entry and/or access to the interior of the vehicle 106 and is in the configuration of a keypad 100. By touching regions of the windshield 132 that are substantially aligned with each of touch zones 110, 112, 114, and 116 in a predetermined sequence, the user may unlock the vehicle 106 or command other components of the vehicle 106. Because keypad 100, and the associated wiring is inside the vehicle (as explained below the electronics and wires are preferably hidden in the A-pillar and under-dash), there is no need for drilling holes or extensive disassembly of vehicle components.

Keypad 100, and in particular first, second, third, and fourth touch zones 110, 112, 114, 116 are preferably used with the capacitive switching methods described above. Thus, when a user touches the windshield 132 in the locations defined by first, second, third, and fourth touch zones 110, 112, 114, 116, a sensing circuit detects the touching event and its zone. The sensing circuit thus reads the user's touch and decodes the number, letter, or general graphic associated with first graphic 120, a second graphic 122, a third graphic 124, and a fourth graphic 126. In this way, the user may enter a code to command an action of a component from outside the vehicle 106 and without a key. Keypad 100 defines a series of circuits having contacts 162, 164, 166, 168, 170, and traces 172, 174, 176, 178, 180, respectively. A capacitive circuit is also electrically connected to the circuit of the conductive layer 206.

As shown in FIG. 5, illumination can be provided by a light source 186 that is typically a series of light emitting diodes (LEDs) mounted on the inside surface of the A-pillar 252 and directed to a back side of the keypad 100. The background areas of the set of graphics 120, 122, 124, 126 are translucent such that the light from the light source 186 will shine through, at least partially, so that graphics 120, 122, 124, 126 are distinguishable.

A finger of a user can touch an outer surface 158 of the windshield 132 to activate one of touch zones 110, 112, 114, 116. Windshield 132 acts as a dielectric element of capacitive sensor 100 such that direct contact of finger to touch zones 110, 112, 114, 116 is not necessary. Moreover, the placement of sensor 100 on the interior of the vehicle 106 allows the sensor 100 to avoid the weather conditions experienced by the exterior of the vehicle 106.

It is important to note that for all of the capacitive sensors or switches discussed herein, it is not necessary for the user's finger, or any other object, to actually come into contact with a touch zone or pad. The sensing circuitry discussed includes the ability to detect the user's finger, or other object, proximal to the sensor and does not require touching contact. Of course, the sensors will also operate when they are touched.

When discussing the distances that are appropriately detectable by a sensor, the configuration of conductive layer 206, and the sensing circuitry determines the range of detection as well as the characteristics of the object to trigger detections. In this way, for example, rain may be rejected as a trigger, while at the same time the sensor may detect a finger in contact with or proximal to a sensor (e.g., about six inches (6") away).

Given the ability to detect an object at a distance as well as in contact, the sensors may be used to perform more than one function depending upon the distance a user's finger is placed. For example, at a distance of about two inches (2") the sensor may turn on the exterior lights to assist entry. When the user touches the sensor, then the combination key entry is made. Thus, the functions of each key may be multiplexed by the distance of the object proximal to the sensor.

In an embodiment having illumination, the keypad 100 also includes an illumination circuit having an illumination trigger region 182 and an illumination electrode 184. Preferably, the illumination circuit is disposed adjacent the circuit of the conductive layer 206 for triggering the light source 186 to illuminate the proximity sensors 100. In particular, the light source 186 passes light through the graphic(s) 120, 122, 124, 126. Traces 172, 174, 176, 178 connect touch zones 110, 112, 114, 116 to contacts 162, 164, 166, 168 respectively. Trace 180 connects contact 170 with illumination trigger region 182 and illumination electrode 184. Contacts 162, 164, 166, 168, 170 allow electrical connection of keypad 100 to electrical sensing devices or ECU's. Contact 170 further connects trace 180 to a driving circuit.

Illumination trigger region 182 is a touch zone of a larger area intended to allow for the user to trigger illumination of keypad 100. Illumination electrode 184 is used to further trigger illumination of keypad 100 when a user is attempting to trigger any of touch zones 110, 112, 114, 116. By routing illumination electrode 184 near and along the outer periphery of touch zones 110, 112, 114, 116, when finger comes in proximity to illumination electrode 184, the sensing circuitry turns on the illumination LED. Moreover, concealing layer 204 provides the outlines of touch zones 110, 112, 114, 116, and comprises graphics 120, 122, 124, 126.

In the embodiment of FIGS. 1-4, the conductive layer 206 is formed from a conductive ink composition with the conductive layer 206 defining the plurality of circuits for controlling any number of components of the vehicle 106 when the user is in proximity to the pane of glass. As specifically shown, the circuits include touch zones 110, 112, 114, 116, contacts 162, 164, 166, 168, and traces 172, 174, 176, 178. The conductive layer 206 can further form contact 170, trace 180, illumination trigger region 182, and illumination electrode 184. The conductive ink composition of the conductive layer 206 is formed by printing, as discussed above in detail. In one exemplary embodiment, the conductive layer 206 comprises a silver-based ink coating of the type described in U.S. Pat. No. 5,636,948 and also described above. However, as discussed above, the conductive layer 206 may be formed in other manners, e.g. using a conductive foil, sputtering or other methods.

The first and second protective layers 208, 210 each comprise a non-conductive printed pattern and provides protection to the conductive layer 206 as well as providing additional colors to the graphics 120, 122, 124, 126. Preferably, the protective layers 208, 210 are formed of at least an opaque colored material. Because keypad 100 is exposed to direct sunlight and extreme temperatures, the protective layers 208, 210 preferably include an additive, such as a ultraviolet (UV) absorber, which protects the conductive layer 206 from the effects of UV rays and substantially prevents UV rays from degrading any inks used. A typical UV absorber for inks is Tinuvin (R) 99 (available from Ciba Specialty Chemicals of Tarrytown, N.Y.). The UV absorber is a viscous liquid UV absorber suitable for use with inks and coatings. In addition to other benefits, Tinuvin (R) 99 has a high thermal stability and environmental permanence. Thus, it is suitable for the automotive environment.

Although the sensor 100 of the embodiment of FIGS. 2-4 is shown as being bonded to the windshield 132, keypad 100 may also be positioned elsewhere on a vehicle (e.g., a side window, rear window, an exterior panel, etc.). Depending on the functions it is intended to perform, keypad 100 may also be positioned on an interior surface (e.g., the dashboard, center console, door panel, seating surface, etc.).

However, in a preferred embodiment, keypad 100 is positioned at an edge of windshield 132 such that the wiring is hidden within A-pillar 134. Moreover, in the A-pillar location, keypad 100 is seamlessly integrated with the trim blending region 102 of windshield 134 giving a finished look. Moreover, at the A-pillar 134 location, retrofitting a vehicle is simplified as access to ECUs or body control modules is easily made due to the proximity of the underside of the dashboard and the associated vehicle control modules/ECUs.

At least one of the conductive layer 206 and one of the protective layers 208,210 define at least are of the graphic formed through these layers 206, 208, 210 for visual identification to the user. In this embodiment, both the conductive layer 206 and the protective layers 208, 210 define the graphics formed through the layers 206, 208, 210 with the graphics at least partially aligned to create the graphics 120, 122, 124, 126 for permitting light to pass through the proximity sensor 100 and to differentiate the graphics 120, 122, 124, 126. Each of the aligned graphics 120, 122, 124, 126 together preferably define the set of aligned graphics 120, 122, 124, 126 as discussed above. Conductive layer 206 is, in a preferred embodiment, a silver conductive ink such as Electrodag 820B (available from Acheson Colloids of Port Huron, Mich.). Connectors (not shown) are mounted as tabs or are glued to windshield 132 (as is known in the art) and are in electrical contact with the touch zones.

As discussed above, protective layers 208, 210 are printed about the conductive layer 206 to seal and protect the conductive layer 206 from moisture, light, abrasion, rubbing, etc. In one embodiment, the protective layer 208,210 can be Nazdar 59102 red (available from Nazdar Company, Chicago, Ill.). The color, in this embodiment red, could be viewed from the outside of the vehicle 106 through windshield 132. In another embodiment, the protective layer 208, 210 is Nazdar 59111 black (available from Nazdar Company, Chicago, Ill.). The color, in this embodiment black, will seamlessly integrate keypad 100 with trim blending region 102 (see FIG. 1). In yet another embodiment, the protective layer 208,210 is Nazdar 59140 clear (available from Nazdar Company, Chicago, Ill.). However, where a clear protective layer 208, 210 is used, conductive layer 206 may be visible to the vehicle occupants. As discussed above, the protective layers 208, 210 are preferably dielectric layers. Further, each of the dielectric layers preferably define a graphic with the graphics at least partially aligned with each other and with the graphics on the conductive layer 206 to further create the graphics 120, 122, 124, 126.

In addition to the conductive layer 206 and protective layers 208, 210, the concealing layer 204 also defines a graphic at least partially aligned with the graphics of the protective 208, 210 layers and the conductive layer 206. The substrate 202, conductive layer 206, and protective layers 208, 210 are preferably formed of a flexible material.

Figure 6:
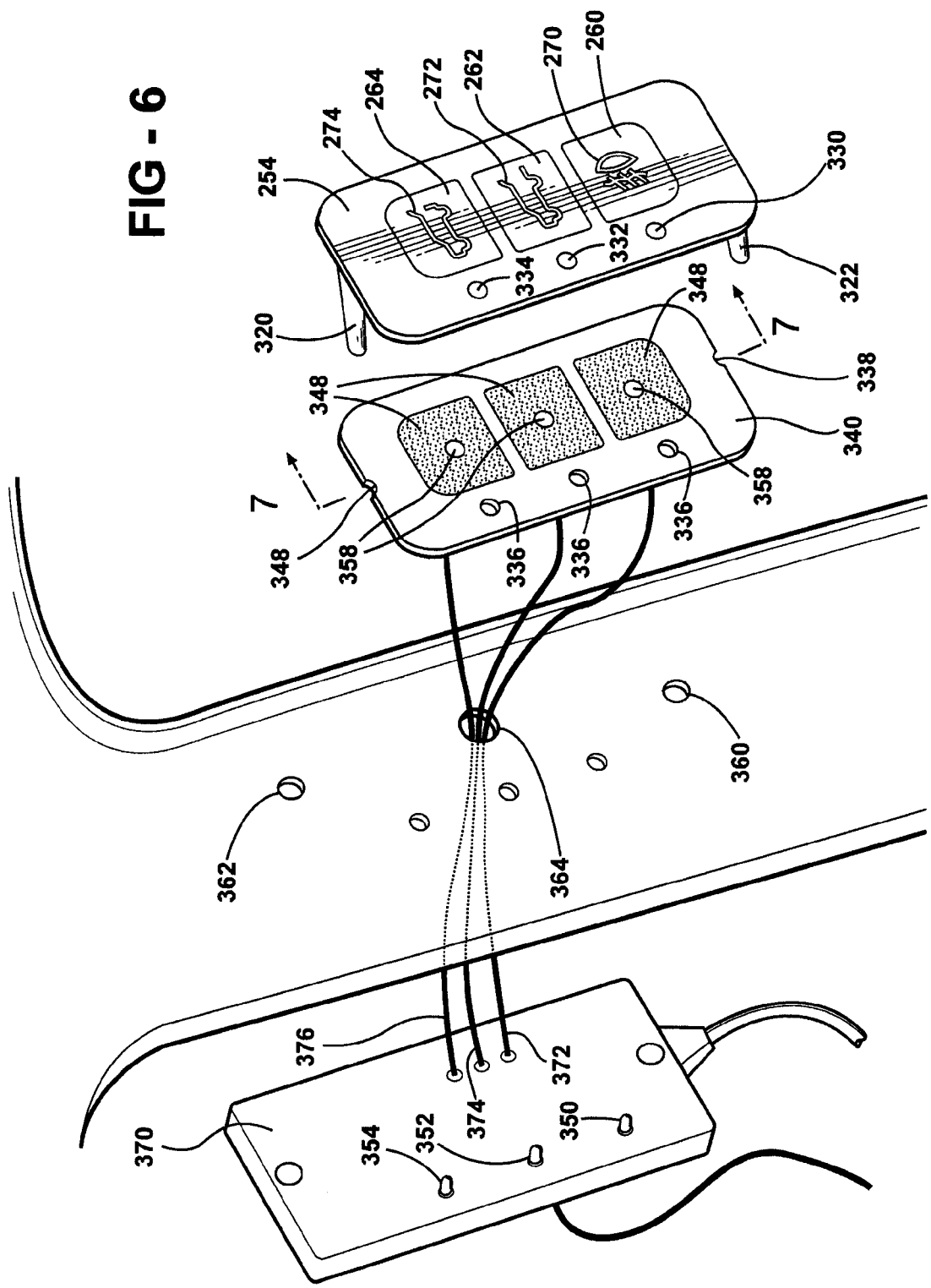
FIG. 6 is an exploded perspective view of a proximity sensor mounted to a pillar of the vehicle.
Figure 7:
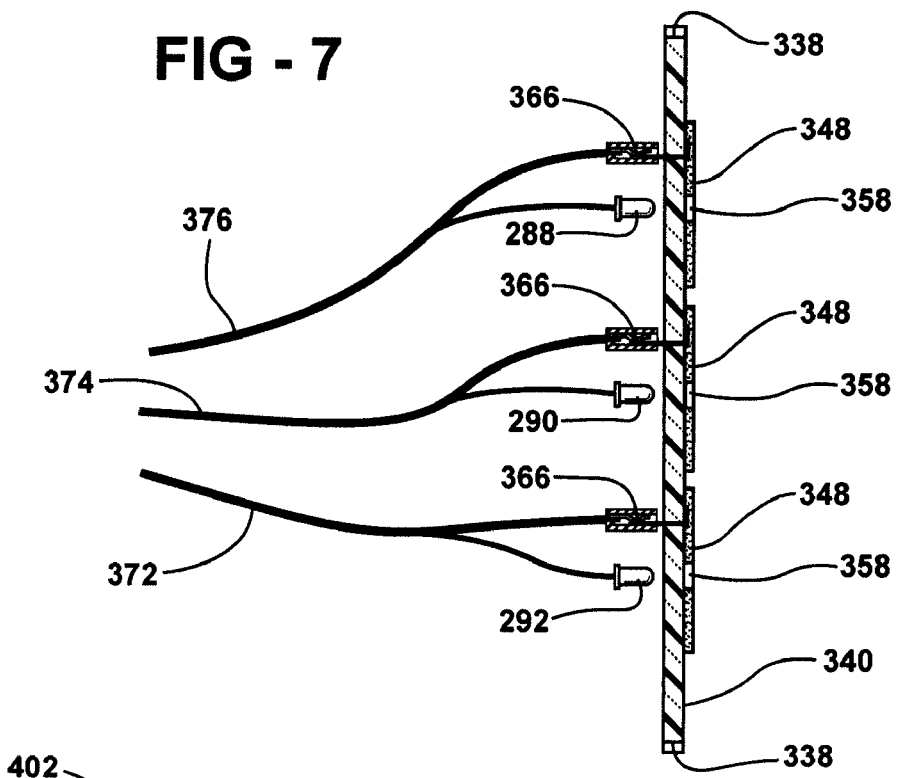
FIG. 7 is a cross-sectional view of the proximity sensor taken along line 7-7 in FIG. 6.

Turning to FIGS. 5-7, another embodiment of a proximity sensor 250 is shown in greater detail. This proximity sensor 250 can be defined as a bezel and is designed to mount to an interior or exterior surface of the vehicle 106 to control various components of the vehicle 106. As shown, the proximity sensor 250 is mounted to the A-pillar 252 within an interior of the vehicle 106. The sensor 250 is configured as a capacitive touch switch 250 having a primary substrate 254 and a protective layer disposed on the primary substrate 254.

The primary substrate 254 includes at least one mounting armature 320, 322 for securing the primary substrate 254 to the surface of the vehicle 106. As illustrated, the mounting armatures 320, 322 for the primary substrate 254 are a pair of location posts 320, 322 for mounting to the A-pillar 252 of the interior of the vehicle 106. A-pillar 252 includes locating holes 360, 362, and a wire-guide hole 364. The location posts 320, 322 align with and are inserted into the location holes 362 and 360, respectively, to securely locate and attach the primary substrate 254 to A-pillar 252.

A conductive layer 348 is coupled to the primary substrate 254 and is preferably formed of a conductive ink composition defining at least one circuit for controlling the component of the vehicle 106 as discussed above.

A secondary substrate 340 is also included with the conductive layer 348, in this embodiment, being mounted to the secondary substrate 340. The secondary substrate 340 is coupled to the primary substrate 254 in any suitable manner. As shown, the secondary substrate 340 is positioned between primary substrate 254 and the A-pillar 252. The secondary substrate 340 includes notches 338 for receiving the posts 320, 322 to align the secondary substrate 340 with the primary substrate 254. By securing the primary substrate 254 to the A-pillar 252, the secondary substrate 340 is securely held there between. The conductive layer 348 is separated into discrete areas and includes voids 358 for permitting back light to pass there through. Specifically, the separate conductive layers 348 align with graphics on the primary substrate 340 as discussed below. The conductive layers 348 may be electrically connected to the wires 372, 374, 376 in any suitable manner. As shown, terminals 366 are included that pass-through the secondary substrate 340 for providing the necessary electrical connection.

Wire-guide hole 364 is drilled through A-pillar 252 to route wires 372, 374, 376 to electronic control unit (ECU) 370. Wires 372, 374, 376 are routed from ECU 370 though wire-guide hole 364 and attach to the secondary substrate 340, where touch zones 260, 262, 264 are sensed and LEDs 228, 290, 292 are controlled. In a preferred embodiment, ECU 370 is mounted within A-pillar 252. However, ECU 370 may be remotely located away from A-pillar 252 with wires 372, 374, 376 being routed to it.

ECU 370 also provides discrete outputs, e.g. light logic or power level outputs, for indicating a status or for driving a relay. In addition to providing control signals, ECU 370 may also communicate with the vehicle body control module (BCM) to deliver the status of switches, as well as provide control, based on BCM commands. Moreover, ECU 370 may not directly control vehicle functions, e.g. door locks, but may command the BCM to take action based on a logic level output, a vehicle network message, or a provided resistance, etc.

ECU 370 may be connected to an A-pillar sensor or switch such as switch 250 and a windshield sensor or switch such as proximity sensor 100. Accordingly, ECU 370 provides electrical connection to sensor 100 as well as providing a light source for illumination of sensor 100 when requested. Thus, ECU 370 is capable of sensing sensor 100 and switch 250, as well as controlling vehicle functions (e.g., unlocking doors, opening rear hatch, etc.) and providing feedback of vehicle statuses via LEDs 350, 352, 354.

As with the embodiment of FIGS. 1-4, the proximity sensor of FIGS. 5-7 includes a first touch zone 260, a second touch zone 262, and a third touch zone 264. A first graphic 270 is associated with the first touch zone 260, a second graphic 272 is associated with the second touch zone 262, and a third graphic 274 is associated with the third touch zone 264. The proximity sensor 250 includes a first feedback LED 350, a second feedback LED 352, and a third feedback LED 354.

When mounted to an interior surface, touch switch or sensor 250 provides a thin, professional appearing switch without taking up significant space. Due to the thin design, switch 250 will not appreciably protrude from the mounting surface. In contrast to typical mechanical switches used for interior switching, the capacitive switches described herein are significantly thinner. For example, a typical mechanical switching assembly may be one to three inches in depth. However, the present embodiments have a thickness of, for example, about one millimeter (1 mm). Thus, when mounting the switches to the vehicle, the packaging constraints minimized because of the thinness of the switch. In some cases, metal-dome-type mechanical switches may be used when thin packaging is a concern. However, such switches are typically substantially more expensive than the capacitive switches described herein.

Additionally, as compared with typical capacitive sensors or switches, the sensors or switches described herein may be placed farther away from the detection circuitry than standard capacitive sensors or switches. In an exemplary embodiment the electronics are placed about eighteen inches (18") from the sensors or switches. Thus, the ECU can be located in a more convenient location than immediately proximal the sensor or switch.

In an exemplary embodiment, primary substrate 254 is made of polypropylene (PP) as is known in the art. The primary substrate is preferably formed of a clear polymeric material. In other embodiments, primary substrate 254 is made of an acrylonitrilebutadiene-styrene (ABS) plastic, Thermoplastic Olefin (TPO), Thermoplastic Polyurethane (TPU), fabric, leather, and nylon. Additionally, primary substrate 254 may be made of filled materials, such as glass filled varieties of the materials listed above. The protective layer is preferably formed of at least an opaque colored material.

Switch 250 is provided to detect the presence of the finger of a user to trigger a switching event associated with each of graphics 270, 272, 274. Switch 250 is structured similarly to sensor 100 and includes the primary substrate 254 and capacitive switch touch zones 260, 262, 264 having a conductive ink layer.

The primary substrate 254 retains and attaches the switch 250 to the A-pillar 252 or any other surface, interior or exterior, of the vehicle 106. Touch zones 260, 262, 264 are provided in this embodiment as separate printed surfaces and include graphics 270, 272, 274. Primary substrate 254 and graphics 270, 272, and 274 act as a dielectric element of capacitive switch 250 such that the user need not directly contact the touch zones 260, 262, 264 to effect switching.

The protective layer includes a graphic through the protective layer for identification by the user. The graphic of the protective layer includes the first set of graphics. The protective layer also includes a second set of graphics spaced from and different from the first set of graphics 270, 272, 274. As illustrated the second set of graphics are a series of feedback light holes 330, 332, 334.

Switch 250 also includes a first light source aligned with the first set of graphics and a second light source aligned with the second set of graphics. The first set of graphics are preferably the set of graphics 270, 272, 274. The second set of graphics are preferably the set of feedback light holes 330, 332, 334. As best shown in FIG. 7, LEDs 288, 290, 292 illuminate through the voids 358 in the conductive layer 348 to illuminate the first set of graphics 270, 272, 274. As best shown in FIG. 6, feedback LEDs 350, 352, 354 extend through apertures 336 in the secondary substrate 340 and the feedback light holes 330, 332, 334 to indicate the status of a button press or the status of a condition of the vehicle 106. If tactile feedback is desired, foam may be placed between switch 250 and A-pillar 252 such that when graphics 270, 272, 274 are pressed by a user, there is a sense of mechanical movement and mechanical resistance consistent with pressing a button.

In a preferred embodiment, location posts 320, 322 are an integral part of primary substrate 254. However, in an alternative embodiment, location posts may also be a separate components mounted from behind A-pillar 252. Feedback light holes 330, 332, 334 are formed in the primary substrate 254 and are aligned with the feedback LEDs 350, 352, 354 and allow for the user to view feedback LEDs when a key is pressed or to indicate a vehicle status (e.g. rear door ajar, fog lights active, etc.). The feedback LEDs 350, 352, 354 are preferably mounted to ECU 370. The first light source, i.e. LEDs 288, 290, 292, is preferably mounted to the secondary substrate 340 in any suitable manner for passing light through the graphic(s) in the conductive layer 348 and through the graphic(s) in the protective layer.

Figure 8:
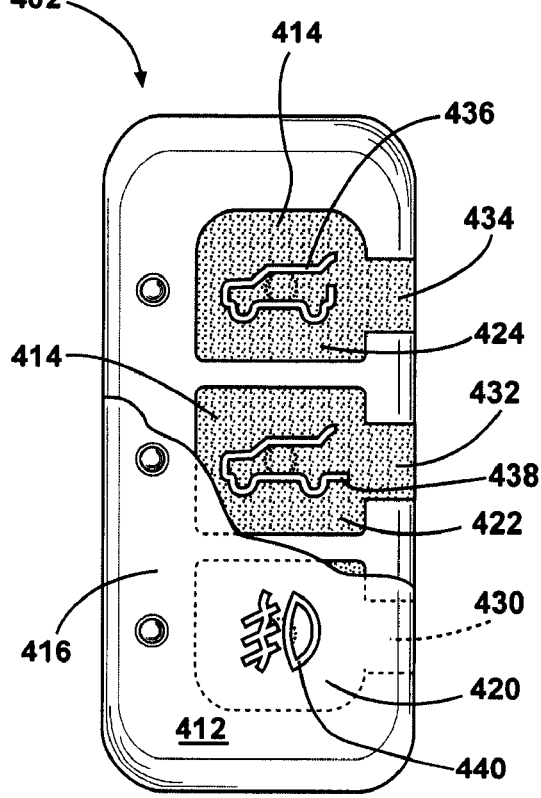
FIG. 8 is a fragmented plan view of an alternative proximity sensor.

Turning to FIG. 8, another embodiment of a proximity sensor 402 is shown. In this embodiment, the proximity sensor 402 is similar in design to the bezel configuration of FIGS. 5-7. However, the secondary substrate has been eliminated. A conductive layer 414 is therefore mounted directly to a primary substrate 412 between the primary substrate 412 and the protective layer 416. Both the conductive layer 414 and the protective layer 416 define a graphic with the graphics at least partially aligned to define a set of graphics 436, 438, 440 for allowing light to pass there through. For illustrative purposes, the sensor 402 of FIG. 8 is fragmented with an upper portion of the sensor 402 having the protective layer 416 removed to show the conductive layer 414 underneath. In this embodiment, there are three direct printed touch zones 420, 422, 424 that are directly printed onto the primary substrate 412. Touch zones 420, 422, 424 are preferably a silver-based ink as described herein. To contact wires 372, 374, 376, wrap around connectors 430, 432, 434 are used at the edge of substrate 412 to provide a circuit path from the front of sensor 402 to the back of sensor 402. The protective layer 416 is of an opaque color matching that of the environment and concealing the wrap around connectors 430, 432, 434. Alternatively, a conductive or non-conductive ink can be used to print a graphic that illustrates the desired switching action on each touch zone 420, 422, and 424.

Figure 9:
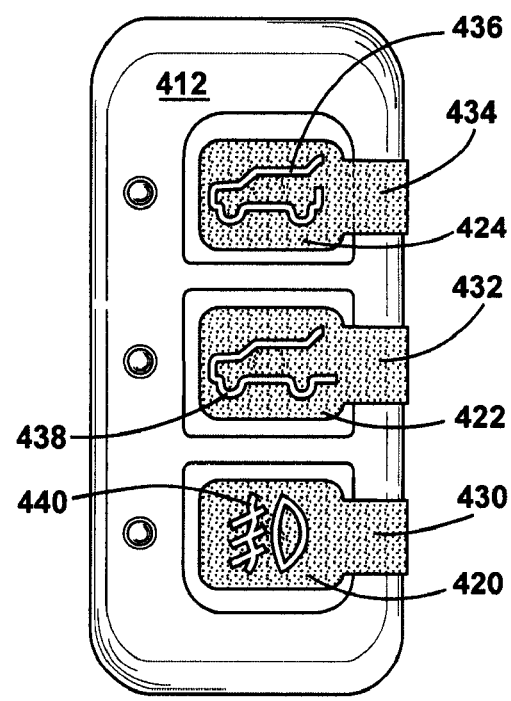
FIG. 9 is a plan view of another alternative proximity sensor.
Figure 10:
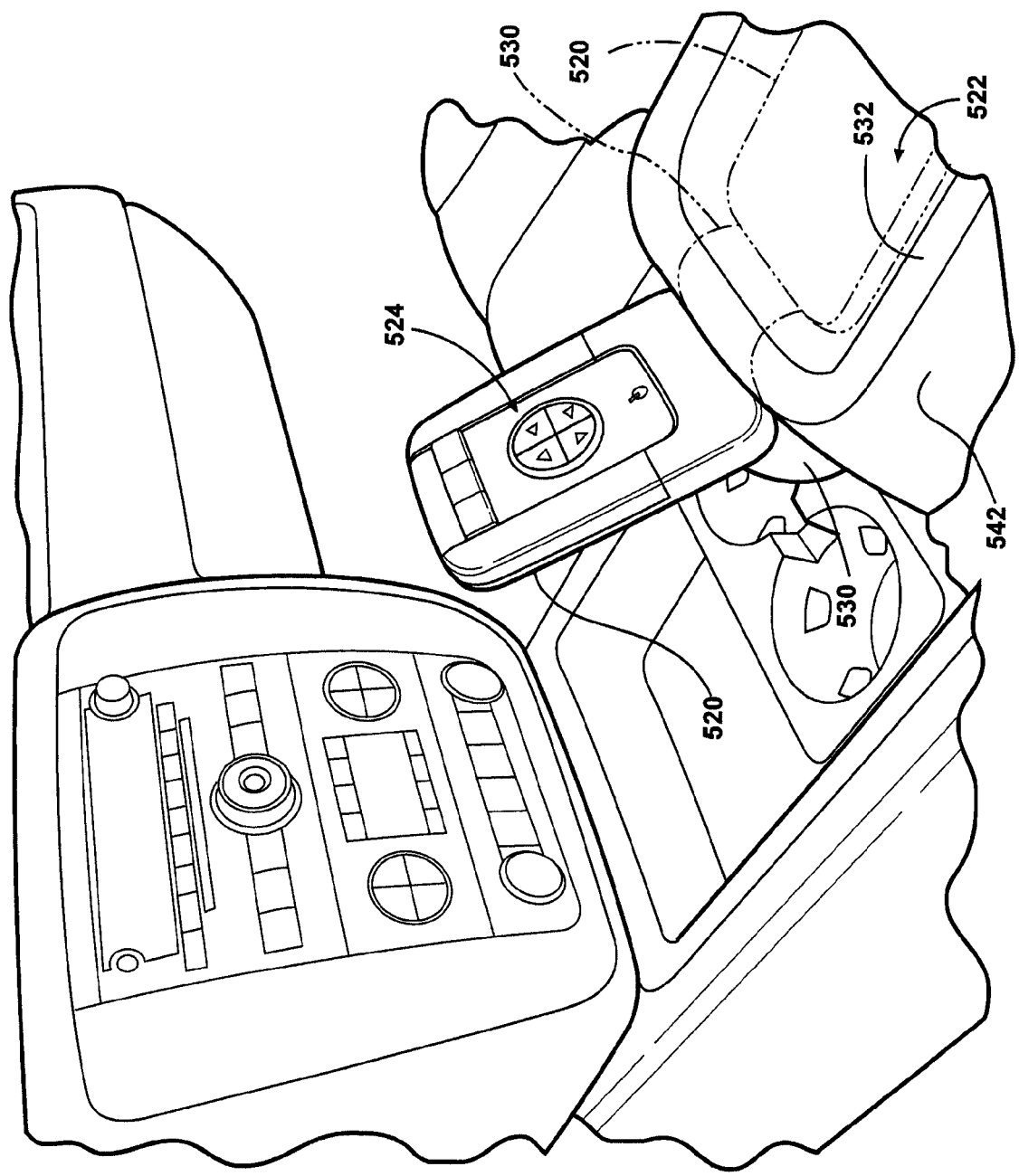
FIG. 10 is a perspective view of the interior of the vehicle with a proximity sensor in accordance with the subject invention disposed on a control panel.

Another embodiment of the proximity sensor 402 is shown in FIG. 9. In this embodiment, each graphic 436, 438, 440 is removably attachable to corresponding locations on the primary substrate 412 to provide for flexibility and interchangeability of the switching functions. By providing graphics separately, an installation may be customized for the functionality of each sensor or switch. That is to say, once switch is installed in the vehicle 106, a graphic may be customized to the desired switching actions and placed over any of touch zones. Thus, a particular touch zone may be customized during installation for a particular purpose. Moreover, if desired, graphics may be replaced and ECU reprogrammed to perform a different function for each touch zone.

Each of the graphics discussed above can be associated with a touch zone which comprises a unique resistance value. In one embodiment, the resistance is determined, for example, by printing a pattern of resistive ink on a desired touch zone. ECU is then programmed with a lookup table that uniquely identifies each of the graphics, based on the unique resistance value, and performs a certain function associated with it. For example, a fog lamp graphic can have about a one kilo-ohm (1 kΩ) resistance associated with it. ECU detects the presence of, for example a finger of the user, in proximity to the touch zone for the fog lamp and also detects the one kilo-ohm (1 kO) resistance. ECU then references the lookup table to determine what function is associated with the about one kilo-ohm (1 kO) touch zone. In the case of a fog-lamp graphic, the function is to toggle the fog-lamps on and off.

In another example, a rear-window graphic can be printed on a touch zone that has about a two kilo-ohm (2 kO) resistance associated with it. ECU detects the presence of, for example a finger of the user, in proximity to touch zone and also detects the two kilo-ohm (2 kO) resistance. ECU then references the lookup table to determine what function is associated with the about two kilo-ohm (2 kO) touch zone. In the case of the rear-window graphic, the function is to open and close the rear window.

In making the predetermined resistance values, e.g., about one kilo-ohm (1 kO) and about two kilo-ohm (2 kO) a method of printing semi-conductive ink on touch zones is used. The resistance is determined by the geometry (i.e., surface area and thickness) of the ink. For example, an area of conductive ink may be printed on each touch zone over an area that is selected to correspond to a desired resistance value. In order to vary the resistance, some of the touch zone may include an unprinted area. The area covered by the conductive ink determines the resistance value associated with the touch zone. A preferred embodiment of a carbon-based semi-conductive ink for forming resistors includes about 49 percent CDI 14644 carbon dispersion, about 42.25 percent Zeneca R972 Urethane dispersion, about one (1) percent RM-8W Rohm & Haas flow thickener, and about 7.75 percent diethylene glycol humectant (all percentages by weight).

In the embodiments of FIGS. 8 and 9, direct printed touch zones 420, 422, 424 are directly printed onto the primary substrate 412. Touch zones 420, 422, 424 are preferably a silver-based ink as described herein. To contact wires 372, 374, 376, wrap around connectors 430, 432, 434 are used at the edge of the primary substrate 412 to provide a circuit path from the front of primary substrate 412 to the back of primary substrate 412.

In another embodiment, the primary substrate may be eliminated and touch zones may be printed directly to A-pillar 252. In this embodiment, the ink is preferably selected to be compatible with the substrate (e.g., a fabric or plastic surface of A-pillar 252) to ensure consistent, uniform printing in each touch zone. Moreover, the embodiments may include printing on the headliner, dash, doors, or any interior or exterior area. These materials may be glass, plastic, leather, synthetic fibers, headlines, fabric laminated foam etc.

In yet another embodiment, a number of interchangeable legends could be provided to be selectively mounted to the primary substrate 254, 412. Each legend would include a graphic that was at least partially aligned with the graphic of the protective layer. The interchangeable legends would each include a different graphic and would adhere or interlock into place against the primary substrate 254, 412. Further, the legends would each include a unique controller chip, resistance, or similar device/material and the ECU would be pre-programmed to recognized each of these unique chips, etc. Hence, when a particular legend was mounted to the primary substrate 254, 412, the ECU would automatically identify a particular function associated with the particular legend.

FIGS. 10-13 illustrate various perspective, plan and exploded views of a control panel 520 incorporating a proximity sensor in accordance with the subject invention. Control panel 520 is attached to a center console 522 and includes a display and input area 524 that is populated with capacitive switching zones, LEDs, or other displays (e.g., LCD, OLED, etc.). Control panel 520 may be used to control vehicle functions (e.g., windows, cruise control, accessories (e.g., radio, CD player, trip computer, communications devices, etc.), or other inputs and outputs.

In a preferred embodiment, control panel 520 is made of polypropylene (PP) as is known in the art. In other embodiments, control panel 520 is made of an acrylonitrile-butadiene-styrene (ABS) plastic, Thermoplastic Olefin (TPO), Thermoplastic Polyurethane (TPU), fabric, leather, and nylon. Additionally, control panel 520 may be made of filled materials, such as glass filled varieties of the materials listed above. As discussed above, capacitive sensors or switches are used for accepting user commands from display and input area 524. Moreover, the sensor or switch inputs may be printed or applied directly to control panel 520 or may be included on a separate substrate, such as substrate 202, which is then affixed to panel 520.

Control panel 520 is connected to center console 522 via a moveable arm 530. As explained below in detail, control panel 520 may be flipped or folded into center console 522 for storage. As appreciated, the control panel 520 may be connected to different components of the center console 522. The control panel 520 can be attached to a center console lid 532 by the moveable arm 530 and a hinge. Moveable arm 530 and hinge are typically made of metal (e.g., steel or aluminum) and are used as support structures. The center console lid 532 is generally attached to a center console base (not shown in FIG. 11) by a hinge that allows a user to open and close center console lid 532, typically located between the front seats of a vehicle. When center console lid 532 is opened, control panel 520 may then be rotated outwardly. The result is that the control panel 520 is extended into the passenger area of the vehicle by moveable arm 530. In a first position, control panel 520 is deployed to the passenger compartment of the vehicle by rotating moveable arm 530. In the deployed first position, the user has access to display and input area 524. In a second position, control panel 520 is stowed by rotating movable arm 530 in a rearward motion (opposite that in first position). When in second position, control panel 520 is housed within center console base 542, and display and input area 524 is inaccessible to the user.

Figure 11:
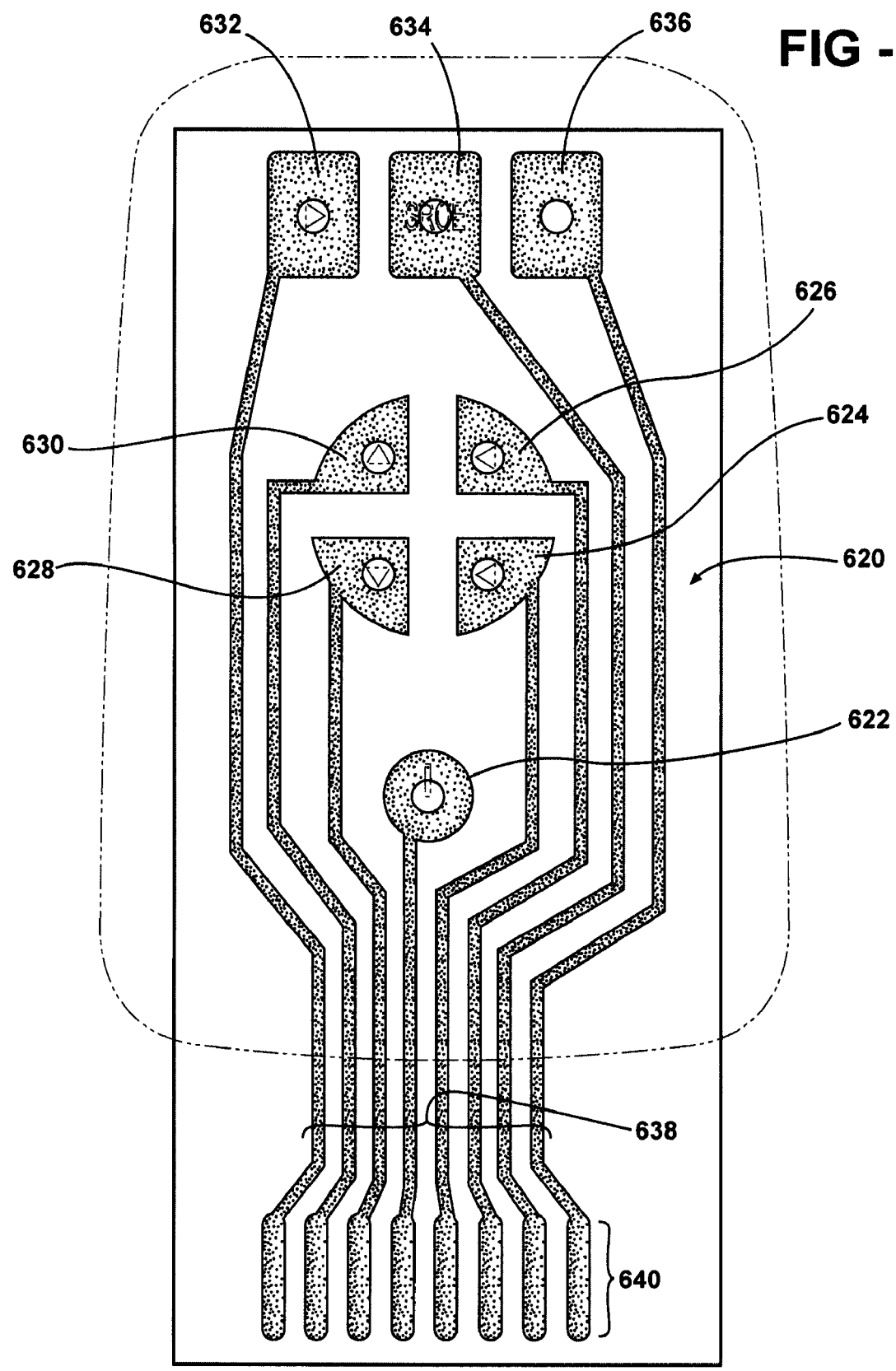
FIG. 11 is a plan view of the circuit of the proximity sensor of FIG. 10.

FIG. 11 is a plan view of a proximity sensor 620 configured as a control panel sensor 620 for use with, for example, control panel 520. The sensor 620 has capacitive sensors or switch touch zones 622, 624, 626, 628, 630, 632, 634, 636, conductive traces 638, and contacts 640, which are, in a preferred embodiment, printed on a PET substrate using silver-based conductive ink (see substrate 202 and conductive layer 206). The PET substrate is affixed to control panel 520. In this exemplary embodiment, touch zone 622 functions as an on/off switch. Touch zones 624 and 626 function as a volume control for a vehicle audio device. Touch zones 628 and 630 function as scroll inputs to any electronic device in the vehicle. Touch zone 632 functions as a "play" input, e.g. to a CD or DVD player. Touch zone 634 functions as a source input, e.g. for an infotainment system. Touch zone 636 functions to trigger a voice command input to the vehicle electronics. The foregoing switch actions are exemplary, and the touch zones may be configured to effect other switching actions.

As discussed above with respect to the previous embodiments, it may be desirable to provide feedback to a user to indicate when a particular touch zone has been activated. The feedback may be sonic, tactile, or visual.

Figure 12:
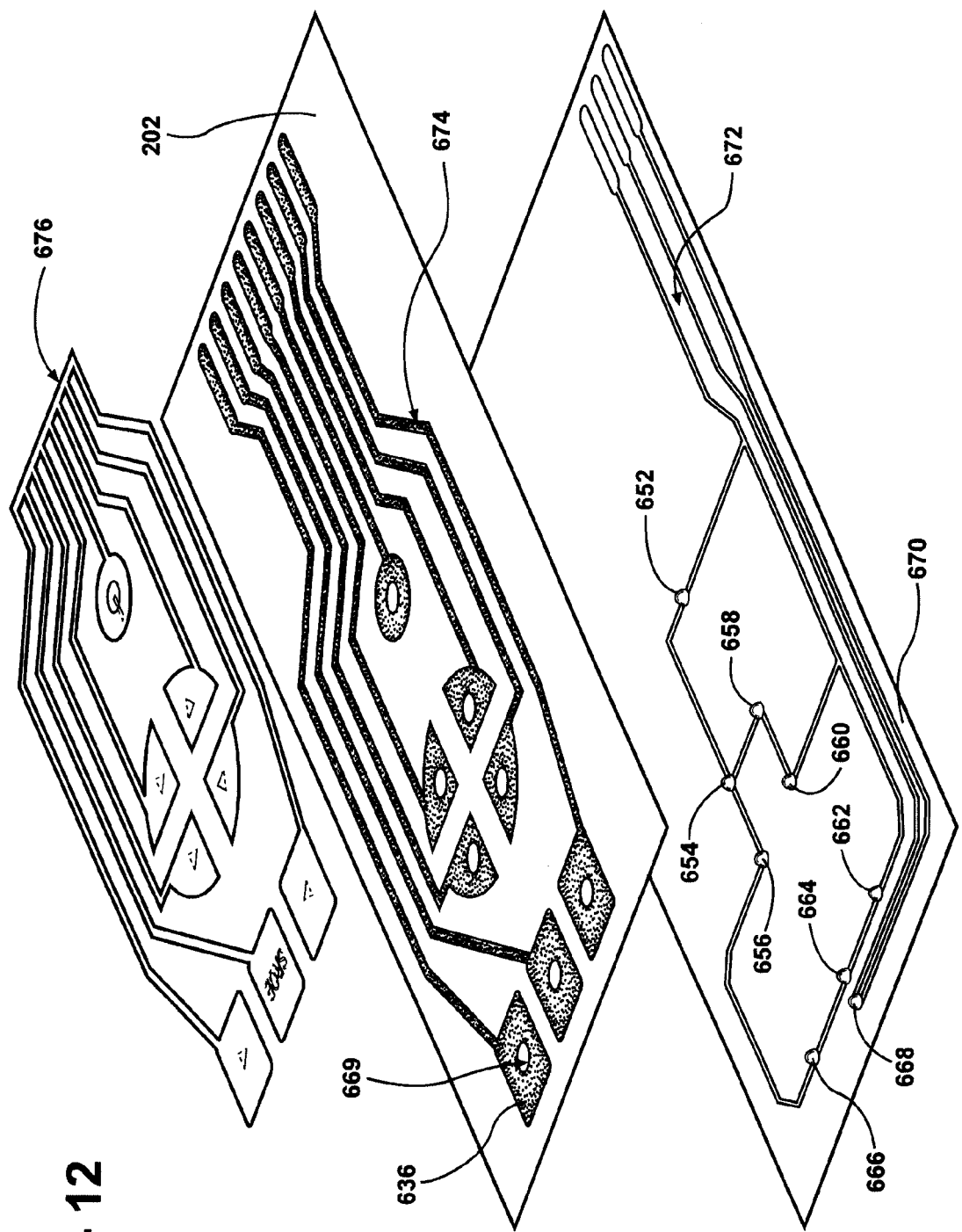
FIG. 12 is an exploded perspective view of certain portions of the proximity sensor for FIG. 10.

In the embodiment of FIG. 12, visual user feedback is provided to indicate when any of touch zones 622, 624, 626, 628, 630, 632, 634, and 636 have been activated. As shown in this figure, control panel sensor panel 620 includes capacitive switch touch zones and LED feedback lamps 652, 654, 656, 658, 660, 662, 664, 666, 668 to provide visual feedback. In this embodiment, each capacitive switch touch zone 622, 624, 626, 628, 630, 632, 634, 636 includes an LED feedback lamp to provide positive feedback that a touch zone was activated. Moreover, a general feedback lamp 668 provides an indication whenever a key is pressed so that the user knows that a command was received.

Alternatively, the LED feedback lamps provide a status as to the current state of the control function. For example, when control panel 520 is active, LED feedback lamp 652 is "on" such that the user knows that control panel 520 is live. In another example, when touch zone 636 triggers a voice command input, LED feedback lamp 666 is "on" for a predetermined time after touch zone 636 is pressed such that the user knows an ECU is waiting for a voice command. If the time period for a voice command expires, for example, LED feedback lamp 666 may extinguish, i.e. turn "off", indicating that a voice command will not be received by the ECU.

The layers include an LED substrate 670, LED traces 672, substrate 202, traces 674, and a protective layer 676. In a preferred embodiment, LED substrate 670 is a PET material as is described above in detail. LED traces 672 are preferably a silver-based ink (described above in detail) applied to LED substrate 670 in a printing process. LED feedback lamps 652, 654, 656, 658, 660, 662, 664, 666 are aligned with touch zones 622, 624, 626, 628, 630, 632, 634, 636. An aperture 669 through, for example, touch zone 636 allows for light from LED feedback lamp 666 to shine through touch zone 636 for observation by the user. LED feedback lamp 668 stands alone and is not associated with a particular touch zone. Protective layer 676 is printed over traces 674 and touch zones 622, 624, 626, 628, 630, 632, 634, 636 to reduce the possibility of damage. Protective layer 676 generally protects against moisture, light, abrasion, rubbing, etc.

Figure 13:
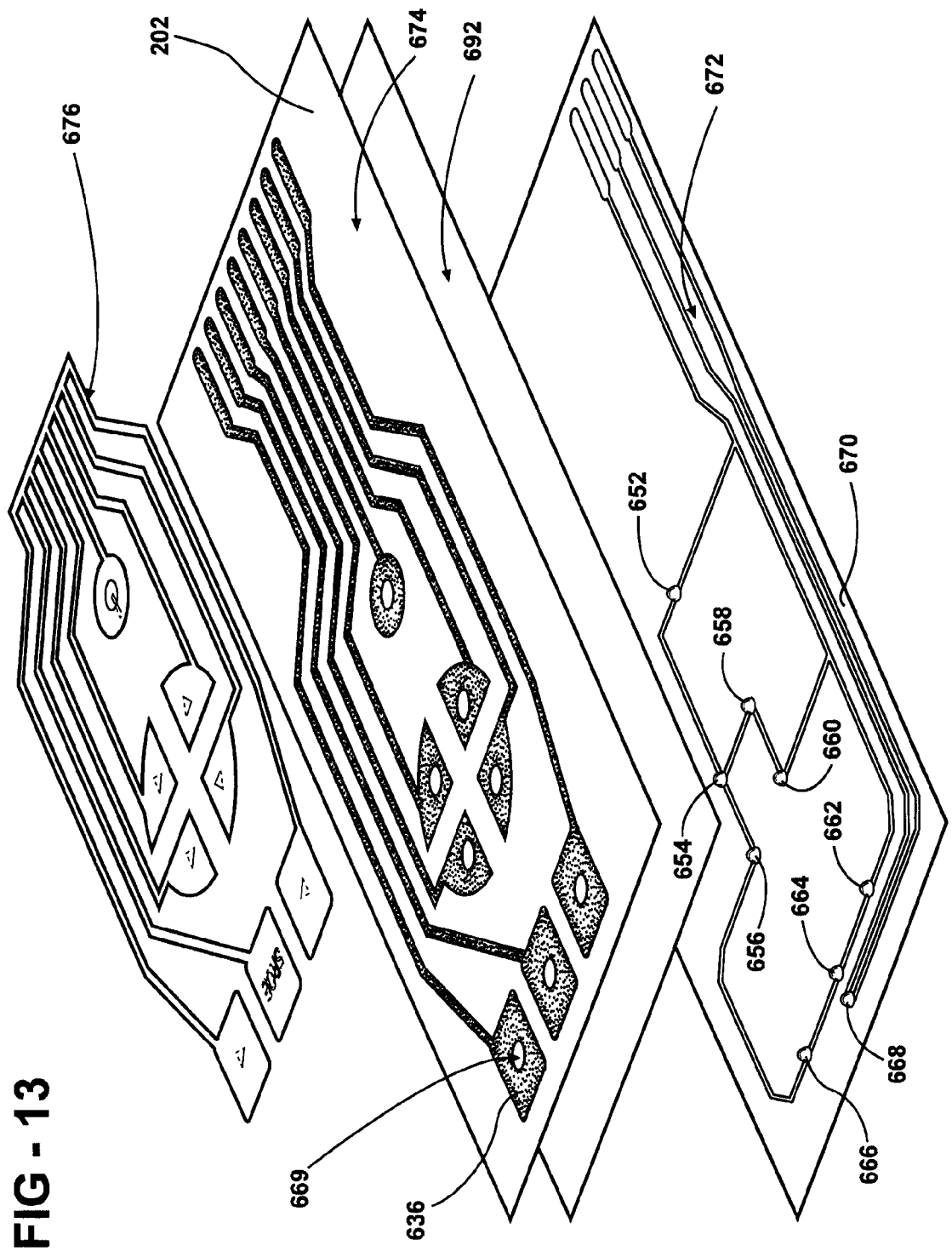
FIG. 13 is an exploded perspective view of an alternative proximity sensor for FIG. 10 illustrating certain portions of this proximity sensor.

FIG. 13 shows an alternative embodiment of FIG. 12 that includes a ground layer 692. Ground layer 692 is, in an embodiment, a printed pattern of conductive ink that is placed between substrate 202 and LED substrate 670. Ground layer 692 reduces interference of the surrounding electromagnetic environment generally. In an example, ground layer 692 reduces interference from driving LED feedback lamps 652, 654, 656, 658, 660, 662, 664, 666, 668, for example, if pulse width modulated.

Figure 14:
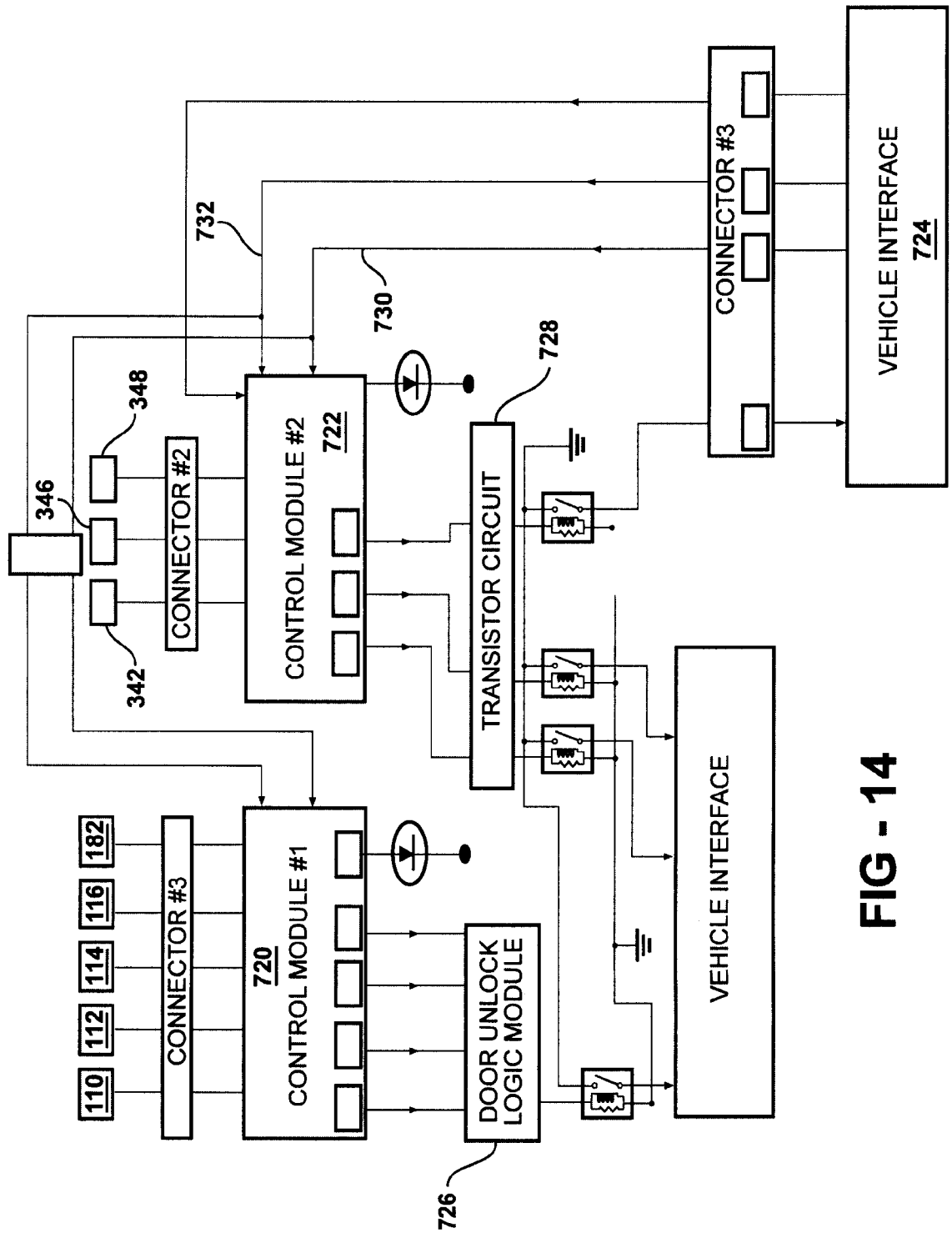
FIG. 14 is a circuit diagram for the proximity sensors of FIGS. 1-9.

FIG. 14 is a circuit diagram of a capacitive switching and control circuit used for keyless entry and A-pillar switches discussed above with reference to FIGS. 1-9. A keyless entry ECU 720 interfaces first, second, third, and fourth touch zones 110, 112, 114, 116. An A-pillar ECU 722 interfaces with sensors 342, 344, 346. Power to ECUs 720 and 722 is supplied by signals 730 and 732 from a vehicle interface 724. ECUs 720 and 722 control vehicle functions (e.g. door unlocking, lift gate control, and fog lamps) via interface circuits 726 and 728, respectively.

Figure 15:
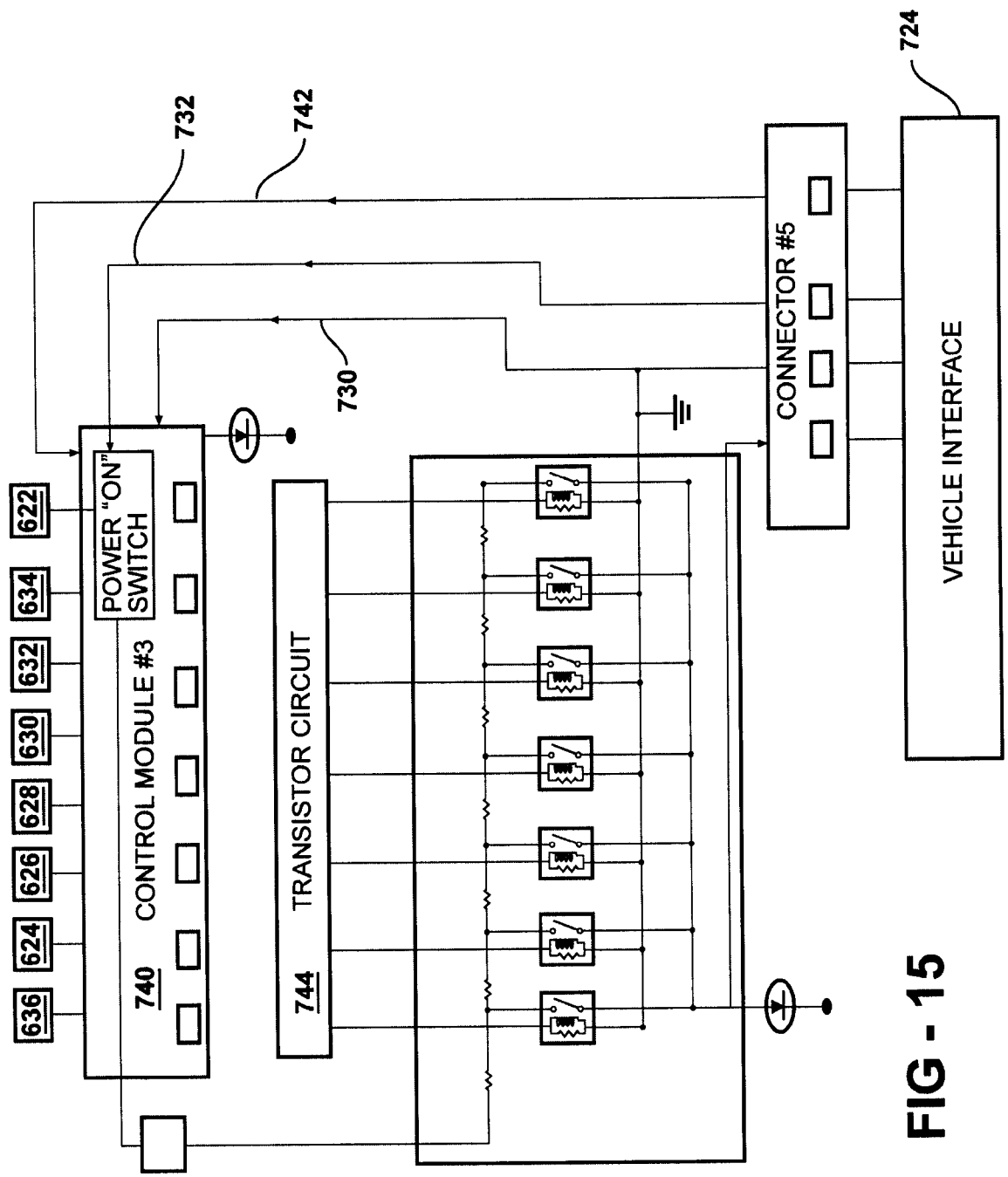
FIG. 15 is a circuit diagram for the proximity sensors of FIGS. 10-13.

FIG. 15 is a circuit diagram of a capacitive switching and control circuit used with the control panel sensor discussed above with reference to FIGS. 10-13. A control panel ECU 740 interfaces capacitive switch touch zones 622, 624, 626, 628, 630, 632, 634, 636. Power to ECU 740 is supplied by signals 730 and 732 from a vehicle interface 724.

Backlight power, if desired, is provided by a backlight signal 742 from vehicle interface 724. ECU 740 controls vehicle functions (e.g., volume up/down, source) via an interface circuit 744. In this embodiment, the vehicle steering wheel includes user operated controls for actuating the vehicle functions, and interface circuit 744 is coupled to the steering wheel inputs for controlling the functions.

Figure 16:
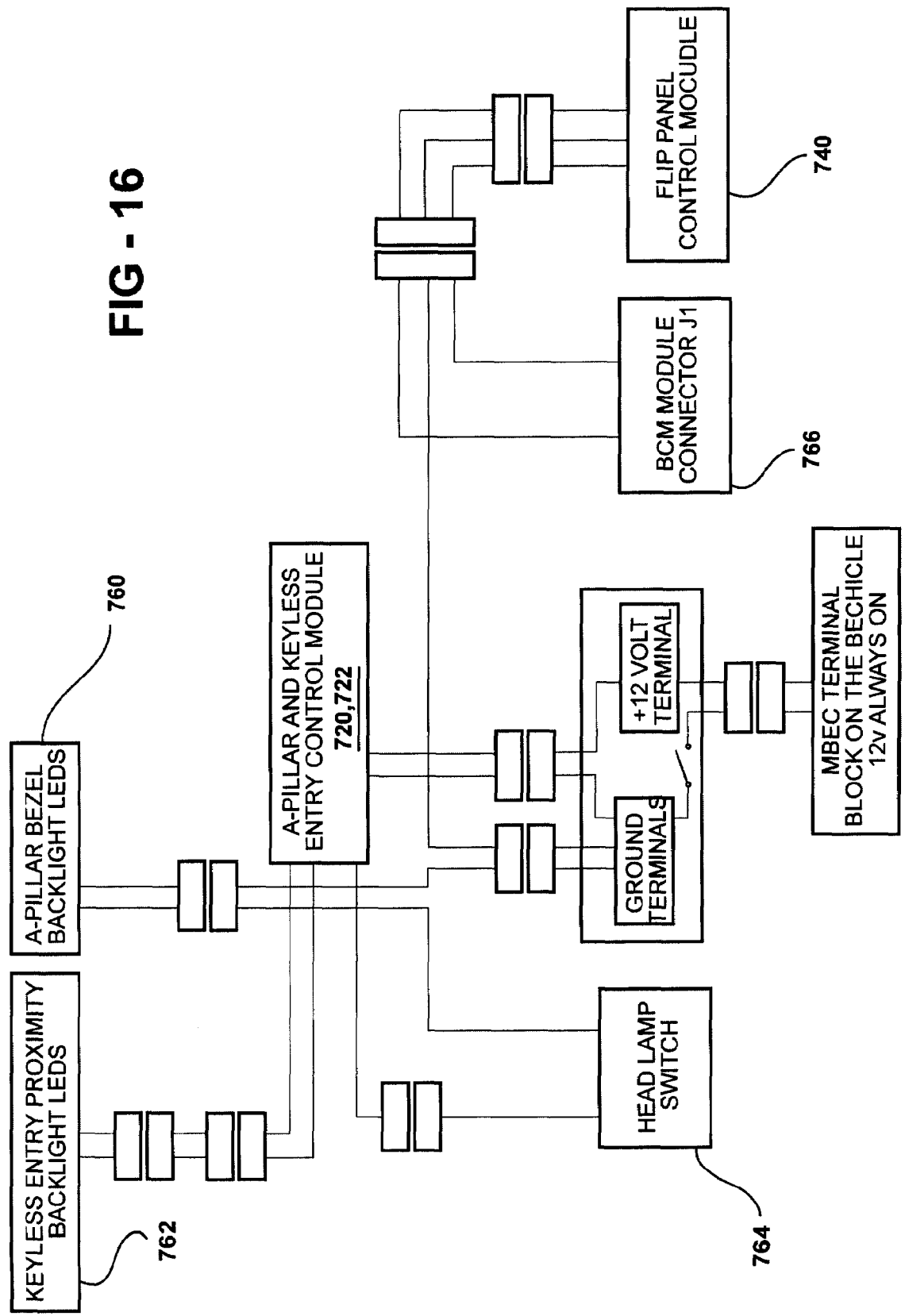
FIG. 16 is a circuit diagram of a vehicle interface diagram for use with the circuits of FIGS. 14 and 15.

FIG. 16 is a circuit diagram of a vehicle interface diagram for use with the circuits discussed immediately above. ECUs 720 and 722 operate to control A-pillar backlights 760 and keyless entry proximity backlight LEDs 762 (used to illuminate sensor 100). Input to ECUs 720 and 722 include the headlight switch 764 (and as described above, keyless entry ECU 720 may illuminate the illumination LED). Control, panel 520 ECU 740 is connected to a radio module 766.

Figure 17:
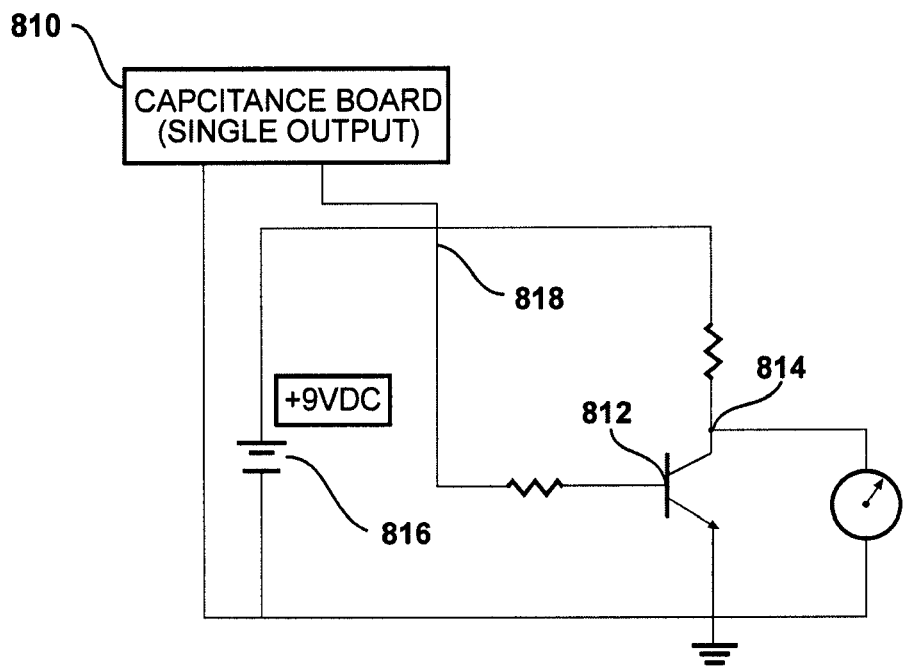
FIG. 17 is a circuit diagram of a voltage output for use with the control circuits of FIGS. 15 and 16.

FIG. 17 is a circuit diagram of a voltage output for use with the control circuits. Each ECU described herein may require an output that provides a voltage to another device or drives a load directly. The control includes an ECU 810, a transistor 812, an output node 814, and a voltage source 816. In the present embodiment, transistor 812 is a general purpose NPN transistor. ECU 810 controls transistor 812 by a control signal 818 connected to the base of transistor 812. When control signal 818 is low, e.g. zero (0) to three (3) volts, transistor 812 switches output node 814 to ground. When control signal 818 is high, e.g. the same potential as voltage source 816, transistor 812 is switched off and output node 814 goes to the potential of voltage source 816. Although the present embodiment uses a general purpose low-side drive configuration, it is understood that a high-side drive, a Darlington output, or a field effect transistor (FET) may also be used.

Figure 18:
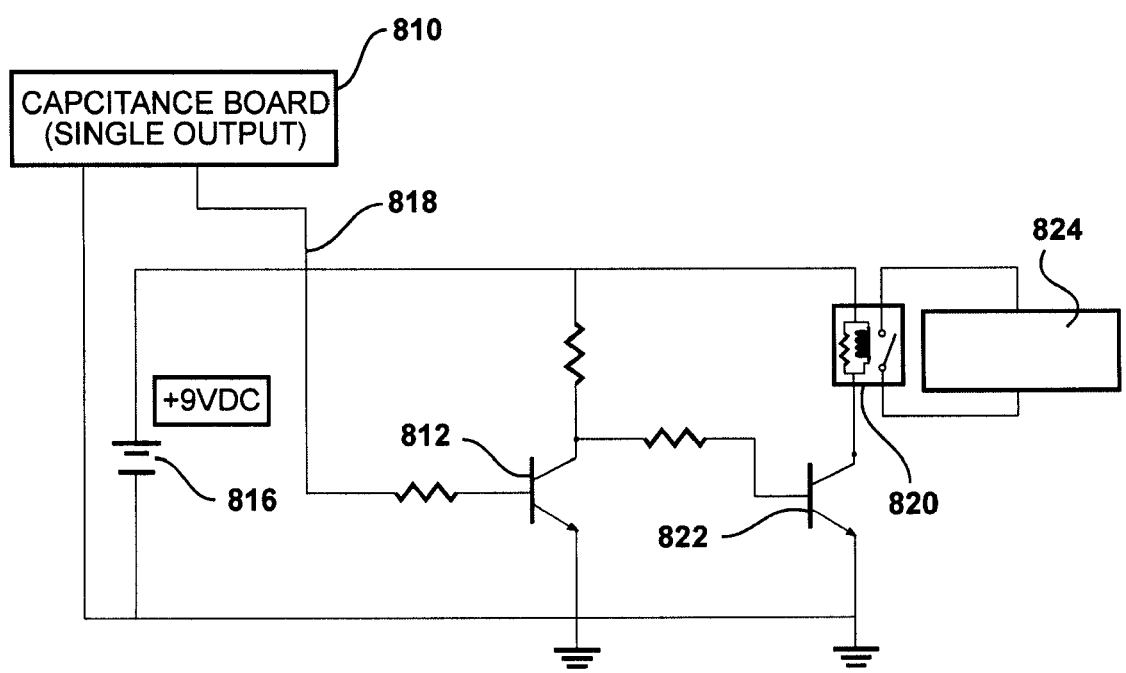
FIG. 18 is a circuit diagram of a relay output for use with the control circuits of FIGS. 15 and 17.

FIG. 18 is a circuit diagram of a relay output for use with the control circuits. ECU 810 controls a relay 820 using a dual transistor configuration similar to a Darlington pair. When control signal 818 is low, e.g. zero (0) to three (3) volts, transistor 812 is grounded and transistor 822 is "off." When control signal 818 is high, e.g. the same potential as voltage source 816, transistor 812 is "on," and transistor 822 conducts energizing relay 820. In this way, the vehicle interface circuit 824 is triggered to perform an action.

The invention has been described in an illustrative manner, and it is to be understood that the terminology which has been used is intended to be in the nature of words of description rather than of limitation. As is now apparent to those skilled in the art, many modifications and variations of the present invention are possible in light of the above teachings. It is therefore, to be understood that within the scope of the appended claims the invention may be practiced otherwise than as specifically described.

What is claimed is:

1. A proximity sensor for controlling a component, said sensor comprising:
  a substrate;
  a conductive layer disposed on said substrate and formed from a conductive ink composition with said conductive layer defining at least one circuit for controlling the component when a user is in proximity to said conductive layer;
  a protective layer disposed over said conductive layer;
  at least one of said conductive layer and said protective layer defining a graphic formed through said layer for visual identification to the user; and
  both of said conductive layer and said protective layer defining a graphic formed through each of said layers with said graphics at least partially aligned for permitting light to pass through the proximity sensor.

2. A proximity sensor as set forth in claim 1 wherein said aligned graphics of said conductive and protective layers each define a set of aligned graphics.

3. A proximity sensor as set forth in claim 1 wherein said protective layer is further defined as a first dielectric layer and further including a second dielectric layer disposed between said conductive layer and said substrate to sandwich said conductive layer between said first and second dielectric layers with said second dielectric layer defining a graphic at least partially aligned with said graphic of said first dielectric layer and said conductive layer.

4. A proximity sensor as set forth in claim 1 wherein said substrate is formed of a clear polymeric material and said protective layer is formed of at least an opaque colored material.

5. A proximity sensor as set forth in claim 1 wherein said substrate, said conductive layer, and said protective layer are formed of a flexible material.

6. A proximity sensor as set forth in claim 1 further including at least one light source for passing light through said graphic.

7. A proximity sensor as set forth in claim 1 wherein said conductive ink composition includes a conductive material selected from the group of silver particles, nickel particles, iron particles, stainless steel particles, graphite particles, carbon particles, carbon nanotubes, conductive polymer, gold particles, platinum particles, palladium particles, copper particles, zinc particles, aluminum particles, silver-coated glass particles, silver coated-copper particles, silver-coated nickel particles, and combinations thereof.

8. A proximity sensor as set forth in claim 1 further including a capacitive circuit electrically connected to said circuit of said conductive layer.

9. A window having an integrated proximity sensor for controlling a component, said window comprising:
    a pane of glass;
    a protective layer coupled to said pane of glass;
    a conductive layer disposed on said protective layer and formed from a conductive ink composition with said conductive layer defining at least one circuit for controlling the component when a user is in proximity to the pane of glass; and
    a substrate coupled to said conductive layer for protecting said conductive layer; and
    both of said conductive layer and said protective layer defining a graphic formed through said layers with said graphics at least partially aligned for permitting light to pass through the proximity sensor.

10. A window as set forth in claim 9 wherein said protective layer is further defined as a first dielectric layer and further including a second dielectric layer disposed between said conductive layer and said substrate to sandwich said conductive layer between said first and second dielectric layers with said second dielectric layer defining a graphic at least partially aligned with said graphics of said first dielectric layer and said conductive layer.

11. A window as set forth in claim 9 further including an adhesive layer disposed between said protective layer and said pane of glass for adhering the proximity sensor to the pane of glass.

12. A window as set forth in claim 9 further including a concealing layer disposed over said conductive with said concealing layer formed of a dark colored material to hide said circuit of said conductive layer and said concealing layer defining a graphic at least partially aligned with said graphic of said conductive layer.

13. A window as set forth in claim 9 further including an illumination circuit disposed adjacent said circuit of said conductive layer for illuminating the proximity sensor to the user.

14. A window as set forth in claim 9 wherein said conductive ink composition includes a conductive material selected from the group of silver particles, nickel particles, iron particles, stainless steel particles, graphite particles, carbon particles, carbon nanotubes, conductive polymer, gold particles, platinum particles, palladium particles, copper particles, zinc particles, aluminum particles, silver-coated glass particles, silver coated-copper particles, silver-coated nickel particles, and combinations thereof.

15. A bezel for mounting to a surface of a vehicle to control a component of the vehicle, said bezel comprising:
    a primary substrate;
    a protective layer disposed on said primary substrate and including a graphic formed through said protective layer for identification by a user;
    a conductive layer coupled to said primary substrate and formed from a conductive ink composition with said conductive layer defining at least one circuit for controlling the component of the vehicle when the user is in proximity to the protective layer;
    a secondary substrate with said conductive layer mounted to said secondary substrate and said secondary substrate coupled to said primary substrate with at least a portion of said conductive ink composition aligned with said graphic of said protective layer; and
    at least one light source mounted to said secondary substrate for passing light through said graphic and said conductive layer including a void for permitting the light from said light source to pass there through.

16. A bezel as set forth in claim 15 wherein said primary substrate include at least one mounting armature for securing said primary substrate to the surface of the vehicle.

17. A bezel as set forth in claim 15 wherein said graphic of said protective layer includes a first set of graphics and wherein said protective layer includes a second set of graphics spaced from and different than said first set of graphics.

18. A bezel as set forth in claim 17 further including a first light source aligned with said first set of graphics and a second light source aligned with said second set of graphics.

19. A bezel as set forth in claim 15 wherein said primary substrate is formed of a clear polymeric material and said protective layer is formed of at least an opaque colored material.

20. A bezel as set forth in claim 15 further including an interchangeable legend selectively mounted to said primary substrate with said legend including a graphic at least partially aligned with said graphic of said protective layer.

21. A bezel as set forth in claim 15 wherein said conductive layer is mounted to said primary substrate between said primary substrate and said protective layer with said conductive layer defining a graphic at least partially aligned with said graphic of said protective layer.

22. A bezel as set forth in claim 15 wherein said conductive ink composition includes a conductive material selected from the group of silver particles, nickel particles, iron particles, stainless steel particles, graphite particles, carbon particles, carbon nanotubes, conductive polymer, gold particles, platinum particles, palladium particles, copper particles, zinc particles, aluminum particles, silver-coated glass particles, silver coated-copper particles, silver-coated nickel particles, and combinations thereof.

* * * * *